US012222650B2

(12) United States Patent
Zi et al.

(10) Patent No.: US 12,222,650 B2
(45) Date of Patent: Feb. 11, 2025

(54) PHOTORESIST UNDERLAYER AND METHOD OF MANUFACTURING A SEMICONDUCTOR DEVICE

(71) Applicant: TAIWAN SEMICONDUCTOR MANUFACTURING CO., LTD., Hsinchu (TW)

(72) Inventors: An-Ren Zi, Hsinchu (TW); Ching-Yu Chang, Yuansun Village (TW)

(73) Assignee: TAIWAN SEMICONDUCTOR MANUFACURING COMPANY, LTD., Hsinchu (TW)

( * ) Notice: Subject to any disclaimer, the term of this patent is extended or adjusted under 35 U.S.C. 154(b) by 344 days.

(21) Appl. No.: 17/150,309

(22) Filed: Jan. 15, 2021

(65) Prior Publication Data

US 2021/0271166 A1 Sep. 2, 2021

Related U.S. Application Data

(60) Provisional application No. 62/982,732, filed on Feb. 27, 2020.

(51) Int. Cl.
*G03F 7/09* (2006.01)
*C08L 101/02* (2006.01)
(Continued)

(52) U.S. Cl.
CPC ............ *G03F 7/094* (2013.01); *C08L 101/02* (2013.01); *G03F 7/0042* (2013.01); *G03F 7/039* (2013.01); *G03F 7/26* (2013.01)

(58) Field of Classification Search
CPC .......... G03F 7/094; G03F 7/095; G03F 7/091; G03F 7/0392; G03F 7/26; G03F 7/039; G03F 7/0042; C08L 101/02
See application file for complete search history.

(56) References Cited

U.S. PATENT DOCUMENTS 6,136,502 A 10/2000 Satoshi et al.
7,871,761 B2 1/2011 Hatakeyama et al.
(Continued)

FOREIGN PATENT DOCUMENTS

CN 101506736 A 8/2009
CN 101835735 A 9/2010
(Continued)

OTHER PUBLICATIONS

Winkle et al., Acid Hardening Positive Photoresist using Photochemical Generation of Base, 1990, Journal of Photopolymer Science and Technology, vol. 3, No. 3, pp. 419-422 (Year: 1990).*
(Continued)

*Primary Examiner* — Sean M DeGuire
*Assistant Examiner* — Andrew Preston Traywick
(74) *Attorney, Agent, or Firm* — STUDEBAKER & BRACKETT PC

(57) ABSTRACT

A method of manufacturing a semiconductor device includes forming a photoresist underlayer including a photoresist underlayer composition over a semiconductor substrate and forming a photoresist layer comprising a photoresist composition over the photoresist underlayer. The photoresist layer is selectively exposed to actinic radiation, and the photoresist layer is developed to form a pattern in the photoresist layer. The photoresist underlayer composition includes: a first polymer having one or more of pendant acid-labile groups and pendant epoxy groups, a second polymer having one or more crosslinking groups, an acid generator, a quencher or photodecomposable base, and a solvent. The photoresist underlayer composition includes 0 wt. % to 10 wt. % of the quencher or photodecomposable base based on a total weight of the first and second polymers.

20 Claims, 12 Drawing Sheets

(51) Int. Cl.

| | |
|---|---|
| ***G03F 7/004*** | (2006.01) |
| ***G03F 7/039*** | (2006.01) |
| ***G03F 7/26*** | (2006.01) |

(56) References Cited

U.S. PATENT DOCUMENTS

| | | | | |
|---|---|---|---|---|
| 8,088,548 | B2 | 1/2012 | Houlihan et al. | |
| 8,481,247 | B2 | 7/2013 | Horiguchi et al. | |
| 8,796,666 | B1 | 8/2014 | Huang et al. | |
| 8,986,918 | B2 | 3/2015 | Breyta et al. | |
| 9,040,225 | B2 | 5/2015 | Chen et al. | |
| 9,093,530 | B2 | 7/2015 | Huang et al. | |
| 9,213,234 | B2 | 12/2015 | Chang | |
| 9,223,220 | B2 | 12/2015 | Chang | |
| 9,256,133 | B2 | 2/2016 | Chang | |
| 9,324,604 | B2 | 4/2016 | Sim et al. | |
| 9,536,759 | B2 | 1/2017 | Yang et al. | |
| 9,548,303 | B2 | 1/2017 | Lee et al. | |
| 9,857,684 | B2 | 1/2018 | Lin et al. | |
| 9,859,206 | B2 | 1/2018 | Yu et al. | |
| 9,875,892 | B2 | 1/2018 | Chang et al. | |
| 11,003,082 | B2 | 5/2021 | Chen et al. | |
| 11,016,386 | B2 | 5/2021 | Zi et al. | |
| 11,036,137 | B2 | 6/2021 | Zi et al. | |
| 11,048,169 | B2 | 6/2021 | Park | |
| 11,287,740 | B2 | 3/2022 | Zi et al. | |
| 2006/0234158 | A1 | 10/2006 | Hatakeyama | |
| 2009/0311624 | A1* | 12/2009 | Horiguchi | G03F 7/091 430/319 |
| 2010/0151382 | A1* | 6/2010 | Hatakeyama | G03F 7/094 430/270.1 |
| 2014/0273521 | A1 | 9/2014 | Wu et al. | |
| 2015/0160552 | A1 | 6/2015 | Lai et al. | |
| 2015/0355539 | A1* | 12/2015 | Namai | C07D 307/77 560/194 |
| 2019/0043710 | A1* | 2/2019 | Chen | H01L 21/26513 |
| 2019/0137876 | A1 | 5/2019 | Robinson et al. | |
| 2019/0196330 | A1* | 6/2019 | Hori | G03F 7/0397 |
| 2019/0384171 | A1 | 12/2019 | Zi et al. | |
| 2020/0041897 | A1 | 2/2020 | Moon et al. | |

FOREIGN PATENT DOCUMENTS

| | | | |
|---|---|---|---|
| CN | 103930828 | A | 7/2014 |
| CN | 104335079 | A | 2/2015 |
| CN | 105319839 | A | 2/2016 |
| CN | 109326511 | A | 2/2019 |
| CN | 109801839 | A | 5/2019 |
| CN | 110609441 | A | 12/2019 |
| CN | 110609443 | A | 12/2019 |
| KR | 10-2013-0046498 | A | 5/2013 |
| TW | 200825626 | A | 6/2008 |
| TW | 201120578 | A | 6/2011 |
| TW | 201329114 | A | 7/2013 |
| TW | 201426197 | A | 7/2014 |
| TW | 201928524 | A | 7/2019 |

OTHER PUBLICATIONS

Pawlowski et al., Novel Photoacid Generators: Key Components for the Progress of Chemically Amplified Photoresist Systems, 1991, Journal of Photopolymer Science and Technology, vol. 4, No. 3, pp. 389-402 (Year: 1991).*

Owendi Ongayi et al., "High Sensitivity Chemically Amplified EUV Resists through Enhanced EUV Absorption", 2012, Proc. of SPIE vol. 8322, 83220T, pp. 1-12.

* cited by examiner 15
10

15a
10

20
15a
10

20
15a
10

30
25
20a
20b
15b
15a
10

20a
15a
20b
15b
10

35
20a
15a
10

35'
15a
10

15'
15
10

15
50
10

15a
50
10

20
15a
50
10

20
15a
50
10

30
25
20a
20b
15b
50
10
15a 20a
15a
20b
15b
50
10

35
20a
15a
50
10

35”
15a
50
10

15
100
95
50
10

15a
100
95
50
10

20
15a
100
95
50
10

20
15a
100
95
50
10

30
25
20a
20b
15b
100
95
50
10
15a 20a
15a
20b
15b
100
95
50
10

35
20a
15a
100
95
50
10

35'''
15a
100
95
50
10

35'''
50
10

PHOTORESIST UNDERLAYER AND METHOD OF MANUFACTURING A SEMICONDUCTOR DEVICE

CROSS-REFERENCE TO RELATED APPLICATION

This application claims priority to U.S. Provisional Patent Application No. 62/982,732, filed Feb. 27, 2020, the entire disclosure of which is incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface of a layer to be patterned and then exposed to an energy that has itself been patterned. Such an exposure modifies the chemical and physical properties of the exposed regions of the photosensitive material. This modification, along with the lack of modification in regions of the photosensitive material that were not exposed, can be exploited to remove one region without removing the other.

However, as the size of individual devices has decreased, process windows for photolithographic processing has become tighter and tighter. As such, advances in the field of photolithographic processing are necessary to maintain the ability to scale down the devices, and further improvements are needed in order to meet the desired design criteria such that the march towards smaller and smaller components may be maintained.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

As feature size decreases below 60 nm pattern pitch, line width resolution suffers. Residual photoresist or scum is difficult to remove in small pitch and high aspect ratio patterns. To improve line width roughness in extreme ultraviolet (EUV) lithography operations a photoresist underlayer is used according to embodiments of the disclosure. The photoresist underlayer is removed during the development operation, thereby removing any residual photoresist or scum overlying the photoresist underlayer. In some embodiments, the photoresist underlayer is a bottom antireflective coating (BARC).

Figures 1A, 1B, 1C, 1D, 1E, 1F, 1I, 1J, 1K:
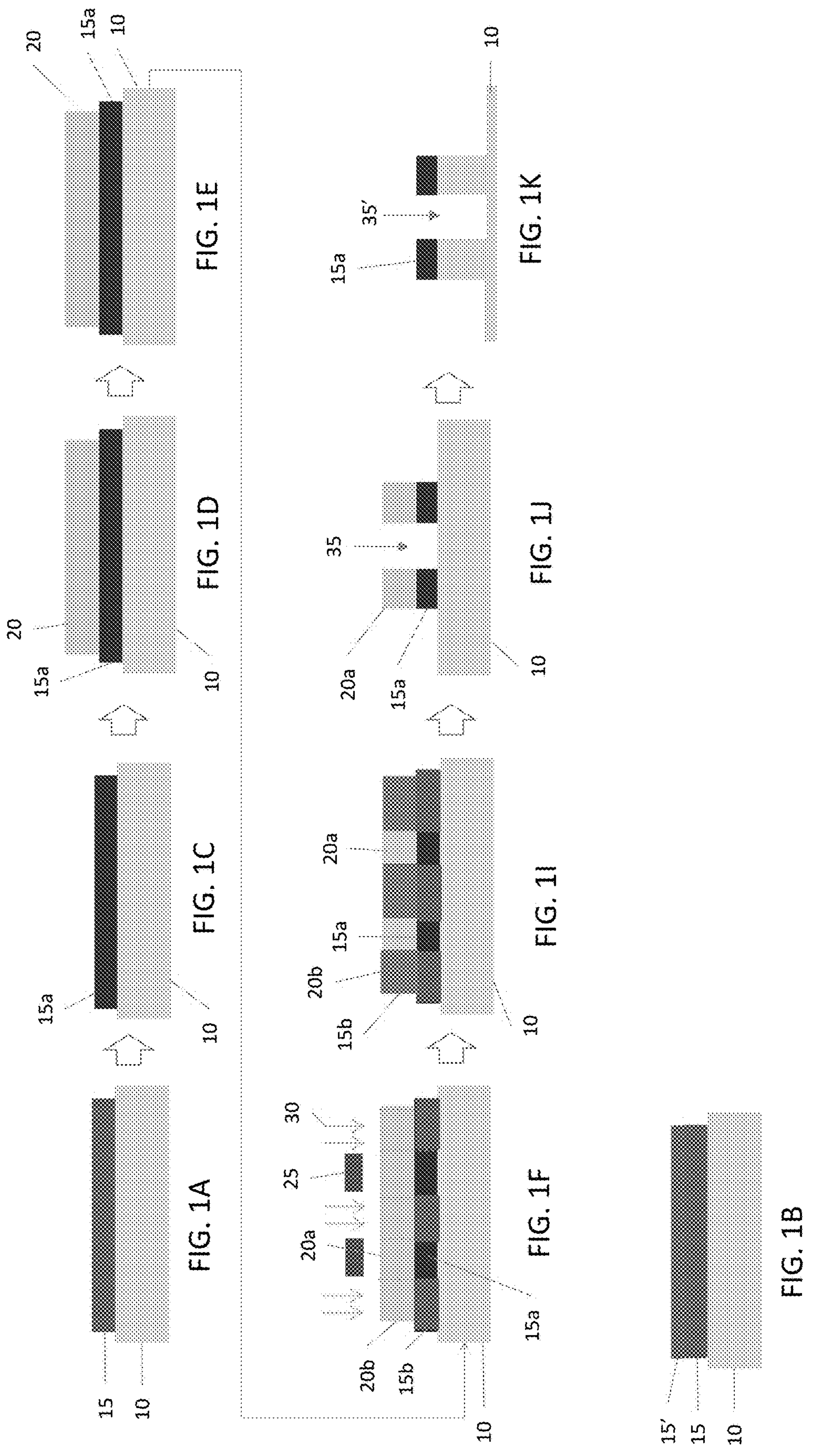
FIGS. 1A, 1B, 1C, 1D, 1E, IF, 1G, 1H, 1I, 1J, and 1K are cross sectional views of sequential operations for manufacturing a semiconductor device according to an embodiment of the disclosure.

FIGS. 1A-1K are cross sectional views of sequential operations for manufacturing a semiconductor device according to embodiments of the disclosure. FIG. 1A shows a photoresist underlayer 15 formed over a substrate 10, such as a semiconductor wafer. In some embodiments, the underlayer 15 is deposited as a liquid mixture and the substrate 10 is rotated while the underlayer is deposited over the substrate 10.

In some embodiments, the substrate 10 includes a single crystalline semiconductor layer on at least its surface portion. The substrate may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate is a silicon layer of an SOI (silicon-on insulator) substrate. In certain embodiments, the substrate is made of crystalline Si. In certain embodiments, the substrate is a silicon wafer.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate. The germanium concentration of the SiGe buffer layers may increase from 30 atomic % for the bottom-most buffer layer to 70 atomic % for the top-most buffer layer.

In some embodiments, the substrate 10 includes at least one metal, metal alloy, and metal/nitride/sulfide/oxide/silicide having the formula $MX_a$, where M is a metal and X is N, S, Se, O, Si, and a is from about 0.4 to about 2.5. In some embodiments, the substrate includes titanium, aluminum, cobalt, ruthenium, titanium nitride, tungsten nitride, tantalum nitride, and combinations thereof.

In some embodiments, the substrate 10 includes a dielectric layer having at least silicon, metal oxide, and metal nitride of the formula $MX_b$, where M is a metal or Si, X is N or O, and b ranges from about 0.4 to about 2.5. Ti, Al, Hf, Zr, and La are suitable metals, M, in some embodiments. In some embodiments, the substrate includes silicon dioxide, silicon nitride, aluminum oxide, hafnium oxide, lanthanum oxide, and combinations thereof.

In some embodiments, the photoresist underlayer 15 includes a photoresist underlayer composition including a polymer having one or more pendant acid-labile groups or one or more pendant epoxy groups, a polymer having one or more crosslinking groups, an acid generator, a quencher or a photodecomposable base, and a solvent. In some embodiments, the acid generator is a photoacid generator.

In some embodiments, the pendant acid-labile groups are about 5 wt. % to about 50 wt. % of the polymer having pendant acid-labile groups or pendant epoxy groups. When the amount of the pendant acid-labile groups is outside the disclosed ranges, there may not be an improvement in the line-width roughness and scum reduction. In some embodiments, the crosslinking groups are about 30 wt. % to about 70 wt. % of the polymer having the crosslinking groups. When the amount of the crosslinking groups is outside the disclosed ranges there may not be an improvement in the line-width roughness and scum reduction.

In some embodiments, photoresist underlayer composition includes 0 wt. % to about 10 wt. % of the quencher or the photodecomposable base. In some embodiments, the photoresist underlayer 15 includes a second layer 15' disposed on the photoresist underlayer (first layer) 15, wherein the second layer 15' includes 0.1 wt. % to about 10 wt. % of the quencher or the photodecomposable base, as shown in FIG. 1B. In some embodiments, amounts of the quencher or photodecomposable base greater than the disclosed range may result in no additional improvement in line-width roughness or scum reduction.

Figure 2A:
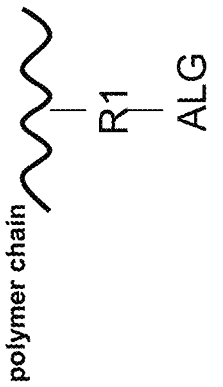
FIG. 2A illustrates a polymer with an acid labile group according to embodiments of the disclosure.
Figure 2B:
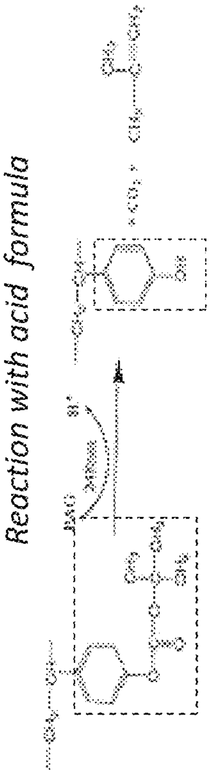
FIG. 2B illustrates a deprotection reaction according to embodiments of the disclosure.
Figure 2C:
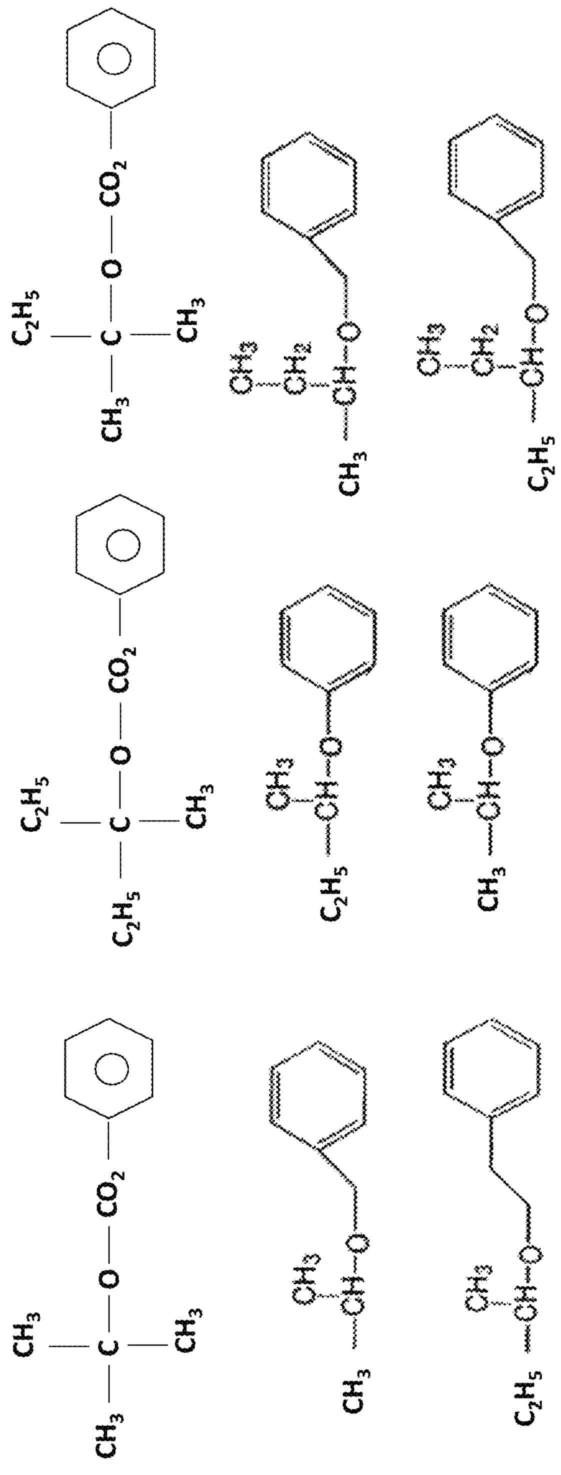
FIG. 2C illustrates examples of acid labile groups according to embodiments of the disclosure.

FIG. 2A illustrates a polymer with an acid labile group (ALG) according to embodiments of the disclosure. FIG. 2B illustrates a deprotection reaction of the ALG according to embodiments of the present disclosure. When the polymer composition is exposed to actinic radiation, for example radiation having a wavelength of 248 nm, the photoacid generator (PAG) generates an acid ($H^+$) that cleaves tert-butyl group from the ALG, such as carbonate group, and producing a hydroxy group (such as a phenol) on the polymer. Examples of ALGs according to embodiments of the disclosure are illustrated in FIG. 2C.

In some embodiments, the polymer in the photoresist underlayer includes a hydrocarbon structure (such as an alicyclic hydrocarbon structure) that includes a repeating unit that forms a skeletal backbone of the polymer resin. This repeating unit may include acrylic esters, methacrylic esters, crotonic esters, vinyl esters, maleic diesters, fumaric diesters, itaconic diesters, (meth) acrylonitrile, (meth) acrylamides, styrenes, vinyl ethers, combinations of these, or the like.

Specific structures that are utilized for the repeating unit of the hydrocarbon structure in some embodiments, include one or more of methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl (meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy) ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate, or the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether, or the like. Examples of styrenes include styrene, methyl styrene, dimethyl styrene, trimethyl styrene, ethyl styrene, isopropyl styrene, butyl styrene, methoxy styrene, butoxy styrene, acetoxy styrene, chloro styrene, dichloro styrene, bromo styrene, vinyl methyl benzoate, a-methyl styrene, maleimide, vinylpyridine, vinylpyrrolidone, vinylcarbazole, combinations of these, or the like.

In some embodiments, the repeating unit of the hydrocarbon structure also has either a monocyclic or a polycyclic hydrocarbon structure substituted into it, or the monocyclic or polycyclic hydrocarbon structure is the repeating unit, in order to form an alicyclic hydrocarbon structure. Specific examples of monocyclic structures in some embodiments include bicycloalkane, tricycloalkane, tetracycloalkane, cyclopentane, cyclohexane, or the like. Specific examples of polycyclic structures in some embodiments include adamantane, norbornane, isobornane, tricyclodecane, tetracyclododecane, or the like.

The group which will decompose, otherwise known as an acid labile group (ALG), is attached to the hydrocarbon structure so that, it will react with the acids/bases/free radicals generated by a photoactive compound, such as a photoacid generator, during exposure to actinic radiation. In some embodiments, the group which will decompose is a carboxylic acid group, a fluorinated alcohol group, a phenolic alcohol group, a sulfonic group, a sulfonamide group, a sulfonylimido group, an (alkylsulfonyl) (alkylcarbonyl) methylene group, an (alkylsulfonyl) (alkyl-carbonyl) imido group, a bis (alkylcarbonyl) methylene group, a bis (alkylcarbonyl) imido group, a bis (alkylsulfonyl) methylene group, a bis (alkylsulfonyl) imido group, a tris (alkylcarbonyl methylene group, a tris (alkylsulfonyl) methylene group, combinations of these, or the like. Specific groups that are used for the fluorinated alcohol group include fluorinated hydroxyalkyl groups, such as a hexafluoroisopropanol group in some embodiments. Specific groups that are used for the carboxylic acid group include acrylic acid groups, methacrylic acid groups, or the like.

Figure 3A:
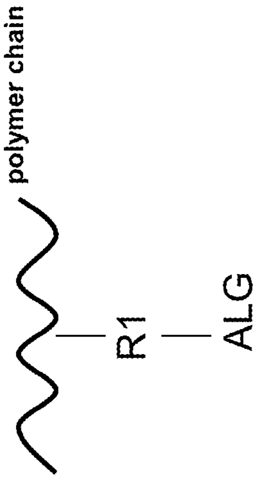
FIG. 3A illustrates a polymer with an acid labile group according to embodiments of the disclosure.
Figure 3B:
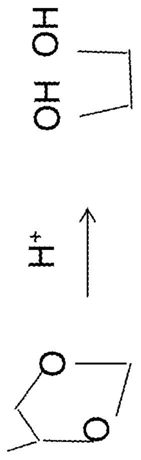
FIGS. 3B and 3C illustrate examples of the ring opening reaction according to embodiments of the disclosure.
Figure 3C:
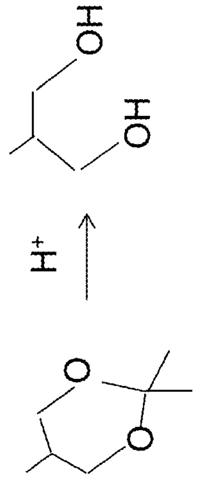

FIG. 3A illustrates a polymer with an acid labile group according to embodiments of the disclosure. FIGS. 3B and 3C illustrate the ring opening reaction, and examples of acid labile groups according to embodiments of the disclosure. In some embodiments, during the ALG reaction, acetal, acetonide, or anhydride groups are decomposed into diol groups. In some embodiments, the acid labile group is connected to the polymer having the pendant acid labile groups or epoxy groups by a connecting group R1 selected from substituted and unsubstituted, branched and unbranched aliphatic groups, branched and unbranched aromatic groups, 1-9 carbon cyclic and non-cyclic groups, unsubstituted or halogen-substituted groups, or —S—, —P—, —P($O_2$)—, —C(═O)S—, —C(═O)O—, —O—, —N—, —C(═O)N—, —$SO_2$O—, —$SO_2$S—, —SO—, and —$SO_2$—, or a carboxylic acid group, ether group, ketone group, ester group, or benzene group. In some embodiments, the ALG is a 5 or 6 member heterocyclic ring. In some embodiments, the ALG is a cyclic acetal group.

Figure 4A:
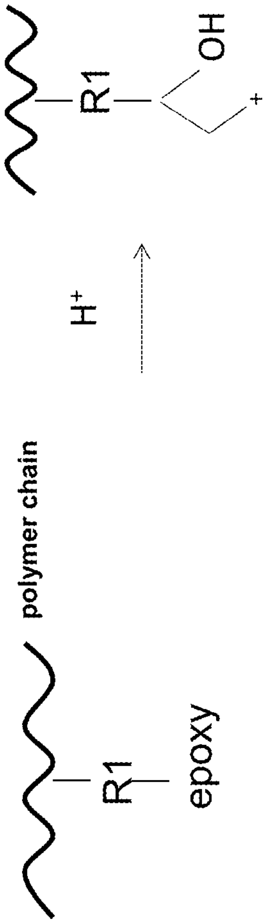
FIG. 4A illustrates a polymer with an epoxy group and an epoxy reaction according to embodiments of the disclosure.
Figure 4B:
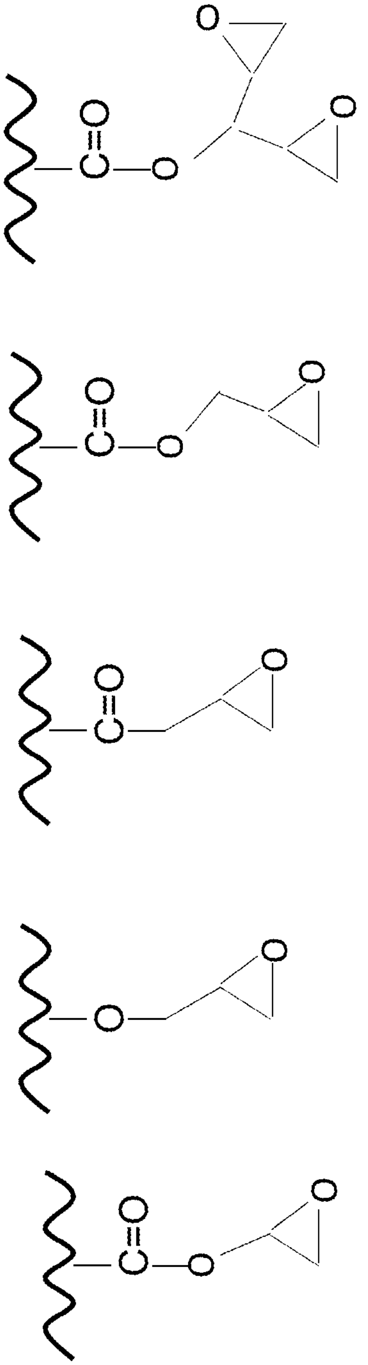
FIG. 4B illustrates examples of polymers with epoxy groups according to embodiments of the disclosure.

FIG. 4A illustrates a polymer with an epoxy group and an epoxy reaction according to embodiments of the disclosure. FIG. 4B illustrates examples of epoxy groups according to embodiments of the disclosure. In the epoxy reaction, hydroxyl groups are formed. In some embodiments, the epoxy group is connected to the polymer having the pendant epoxy groups by a connecting group RI selected from substituted and unsubstituted, branched and unbranched aliphatic groups, branched and unbranched aromatic groups, unsubstituted or halogen-substituted 1-9 carbon cyclic and non-cyclic groups, or —S—, —P—, —P($O_2$)—, —C(═O)S—, —C(═O)O—, —O—, —N—, —C(═O)N—, —$SO_2$O—, —$SO_2$S—, —SO—, and —$SO_2$—, or a carboxylic acid group, ether group, ketone group, ester group, or benzene group.

Figure 5:
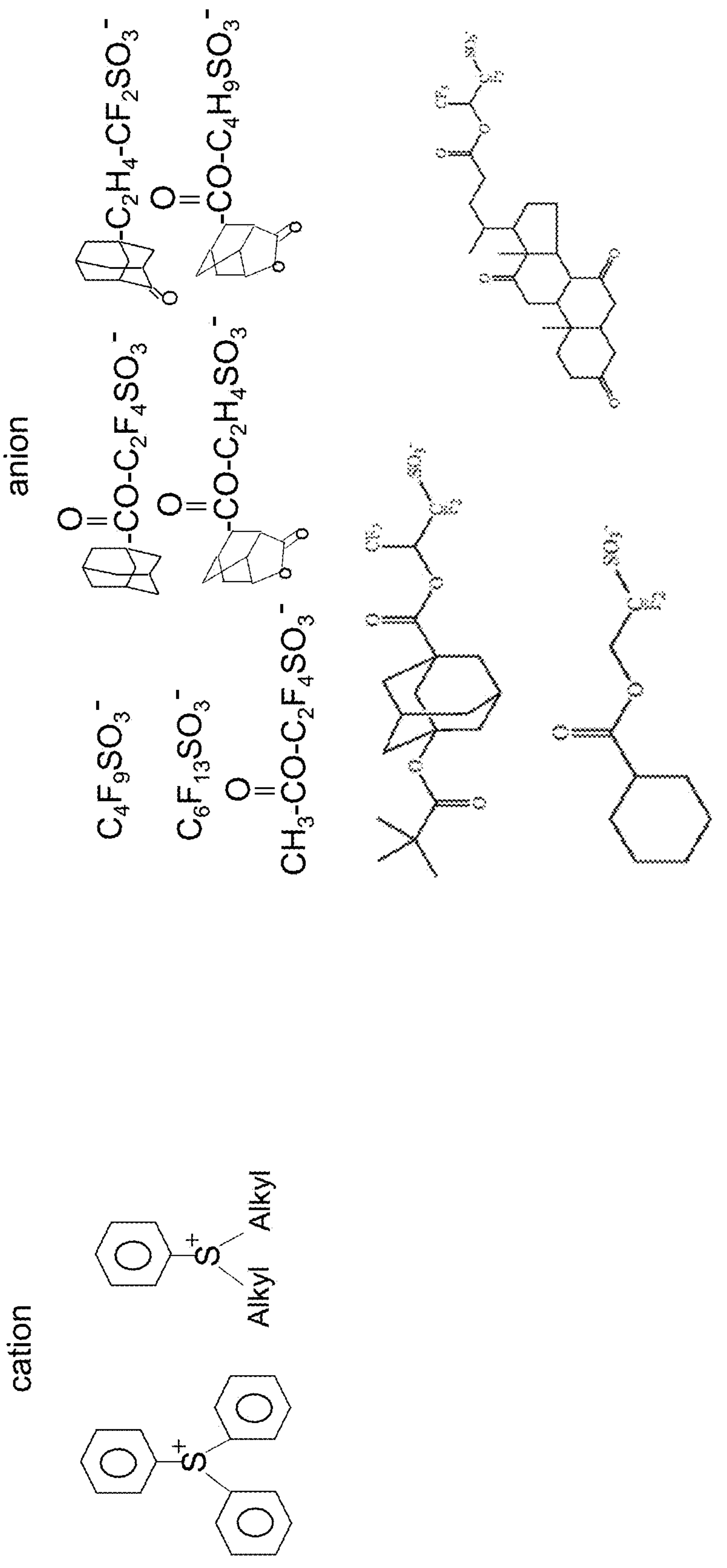
FIG. 5 illustrates examples of photoacid generators according to embodiments of the disclosure.

FIG. 5 illustrates examples of the photoacid generators according to embodiments of the disclosure. The photoacid generators include a combination of a cation and anion in some embodiments, such as one of the cations and anions shown in FIG. 5. Examples of photoacid generators according to embodiments of the disclosure include α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl) iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like.

In some embodiments, the concentration of the photoacid generator ranges from about 1 wt. % to about 20 wt. % based on the total weight of the photoacid generator and the polymers. In other embodiments, the concentration of the photoacid generator ranges from about 10 wt. % to about 15 wt. % based on the total weight of the photoacid generator and the polymers. At concentrations of the photoacid generator below the disclosed range there may not be enough acid generated to improve the line width roughness and reduce scum. At concentrations of the photoacid generator greater than the disclosed range, there may not be a significant improvement or there may be an increase in line width roughness and scum.

Figure 6:
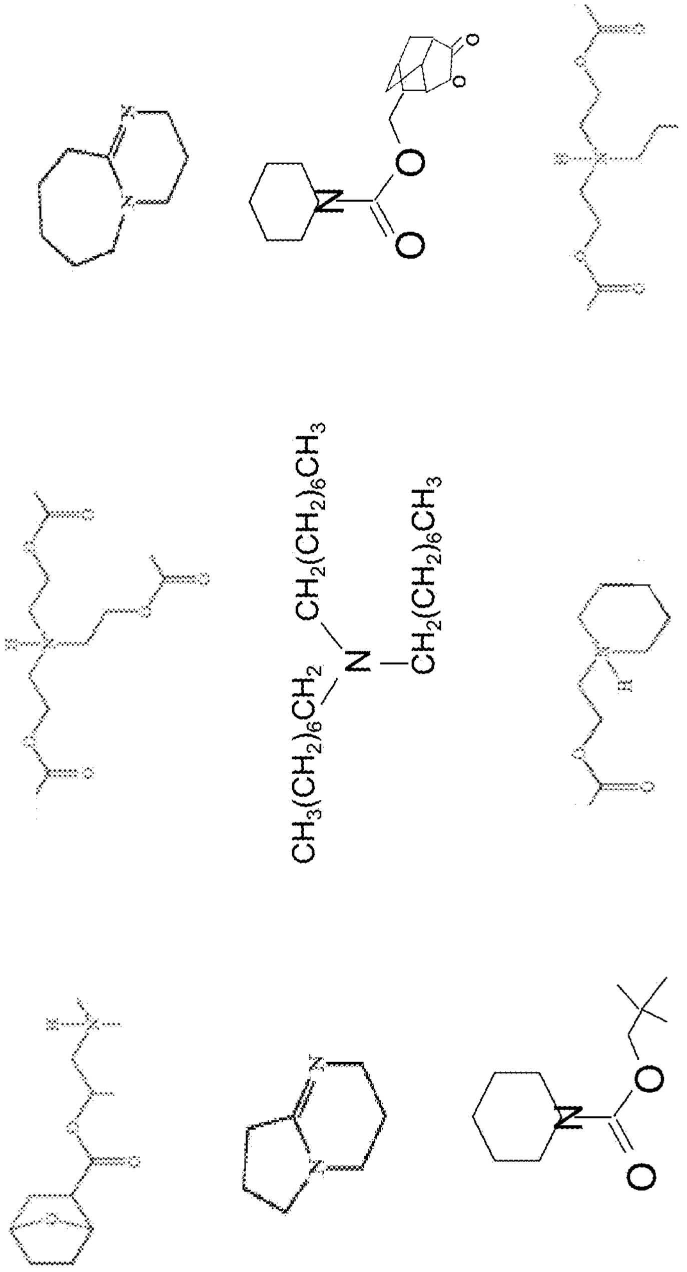
FIG. 6 illustrates examples of quenchers according to embodiments of the disclosure.

FIG. 6 illustrates examples of quenchers according to embodiments of the disclosure. In some embodiments, the quencher inhibits the diffusion of the generated acids or bases within the photoresist underlayer, so that the photogenerated acids or bases are prevented from diffusing into portions of the photoresist underlayer that are not exposed to the actinic radiation.

Figure 7A:
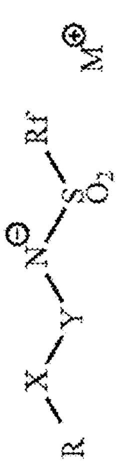
FIG. 7A illustrates a structure of photodecomposable bases according to embodiments of the disclosure.
Figure 7B:
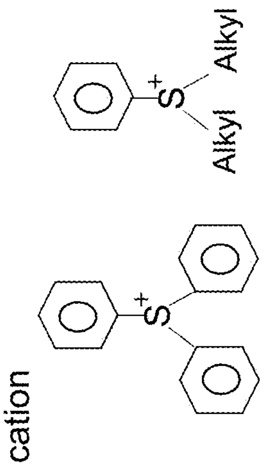
FIG. 7B illustrates examples of photodecomposable bases according to embodiments of the disclosure.
Figure 7B:
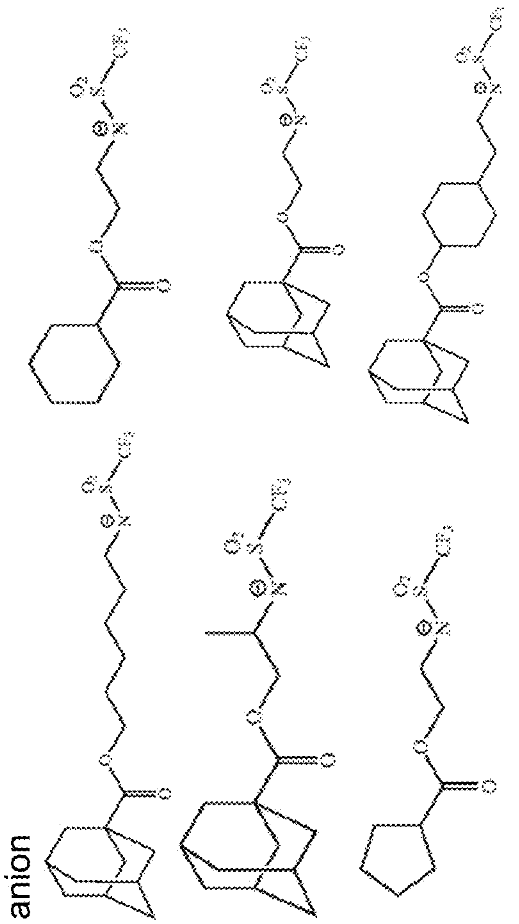

FIG. 7A illustrates a photodecomposable base structure according to embodiments of the disclosure. The photodecomposable base includes a combination of a cation and an anion in some embodiments. R represents a substituted or unsubstituted alicyclic group of 5 or more carbon atoms. X represents a divalent linking group. Y represents linear, branched or cyclic alkylene groups or an arylene group. Rf represents a hydrocarbon group containing a fluorine atom. $M^+$ represents an organic cation or a metal cation. Examples of the cations and anions are illustrated in FIG. 7B.

Figure 8A:
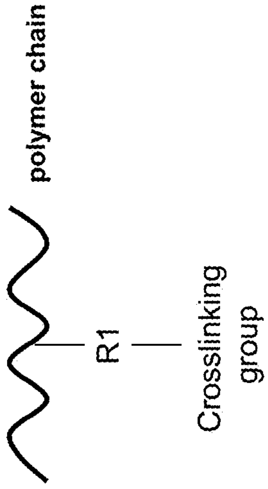
FIG. 8A illustrates a polymer with a crosslinking group according to embodiments of the disclosure.
Figure 8B:
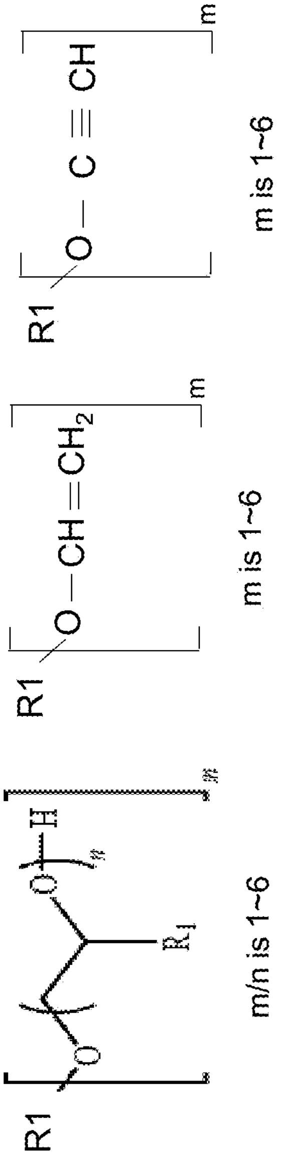
FIG. 8B illustrates examples of crosslinking groups according to embodiments of the disclosure.

FIG. 8A illustrates a polymer with a crosslinking group according to embodiments of the disclosure and examples of crosslinking groups according to embodiments of the disclosure. The crosslinking groups are activated by heating the composition to a temperature of about 80° C. to about 300° C. Examples of the crosslinking groups are illustrated in FIG. 8B. In some embodiments, the crosslinking group is connected to the polymer with a crosslinking group by a connecting group R1 selected from substituted and unsubstituted, branched and unbranched aliphatic groups, branched and unbranched aromatic groups, unsubstituted or halogen-substituted 1-9 carbon cyclic and non-cyclic groups, or —S—, —P—, —P($O_2$)—, —C(═O)S—, —C(═O)O—, —O—, —N—, —C(═O)N—, —$SO_2$O—, —$SO_2S$—, —SO—, and —$SO_2$—, or a carboxylic acid group, ether group, ketone group, ester group, or benzene group.

In some embodiments, the polymer main chain having the pendant ALG or crosslinking group is a hydrocarbon chain. In some embodiments, the polymer is a polyhydroxystyrene, polyacrylate, or polymethylmethacrylate based polymer.

In some embodiments, the polymer also includes other groups attached to the hydrocarbon structure that help to improve a variety of properties of the polymerizable resin. The polymer includes one or more alicyclic hydrocarbon structures that do not contain a decomposable group in some embodiments. In some embodiments, the hydrocarbon structure that does not contain a group which will decompose includes structures such as 1-adamantyl (meth)acrylate, tricyclodecanyl (meth)acrylate, cyclohexyl (methacrylate), combinations of these, or the like.

In some embodiments, the photoresist underlayer 15 has a thickness ranging from about 2 nm to about 1 μm. In some embodiments, the thickness of the photoresist underlayer ranges from about 5 nm to about 500 nm, and in other embodiments, the thickness of the photoresist underlayer ranges from about 10 nm to about 200 nm. Photoresist underlayer thicknesses less than the disclosed ranges may be insufficient to provide adequate photoresist adhesion and anti-reflective properties. Photoresist underlayer thicknesses greater than the disclosed ranges may be unnecessarily thick and may not provide further improvement in resist layer adhesion and scum reduction.

The individual components of the photoresist underlayer composition are placed into a solvent, in order to aid in the mixing and dispensing of the photoresist underlayer. To aid in the mixing and dispensing of the photoresist, the solvent is chosen at least in part based upon the materials chosen for the polymers as well as the photoacid generators. In some embodiments, the solvent is chosen such that the polymer resins and the photoacid generators can be evenly dissolved into the solvent and dispensed upon the layer to be patterned.

In some embodiments, the solvent is an organic solvent, and includes one or more of any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the solvent for the photoresist underlayer composition include, acetone, methanol, ethanol, propanol, isopropanol (IPA), n-butanol, toluene, xylene, 4-hydroxy-4-methyl-2-pentanone, tetrahydrofuran (THF), methyl ethyl ketone, cyclohexanone (CHN), methyl isoamyl ketone, 2-heptanone (MAK), ethylene glycol, 1-ethoxy-2-propanol, methyl isobutyl carbinol (MIBC), ethylene glycol monoacetate, ethylene glycol dimethyl ether, ethylene glycol methylethyl ether, ethylene glycol monoethyl ether, methyl cellosolve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, diethethylene glycol monoethyl ether, diethylene glycol monobutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, methyl acetate, ethyl acetate, propyl acetate, n-butyl acetate (nBA), methyl lactate, ethyl lactate (EL), propyl lactate, butyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monomethyl ether propionate, propylene glycol monoethyl ether propionate, propylene glycol methyl ether acetate, propylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, ethyl 3-ethoxypropionate, methyl 3-methoxypropionate, methyl 3-ethoxypropionate, and ethyl 3-methoxypropionate, β-propiolactone, β-butyrolactone, γ-butyrolactone (GBL), α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, propylene carbonate, vinylene carbonate, ethylene carbonate, butylene carbonate, acetate-2-methoxyethyl, acetate-2-ethoxyethyl, acetate-2-(2-ethoxyethoxy) ethyl, acetate-3-methoxy-3-methylbutyl, acetate-1-methoxy-2-propyl, dipropylene glycol, monomethylether, monoethylether, monopropylether, monobutylether, monophenylether, dipropylene glycol monoacetate, dioxane, methyl pyruvate, ethyl pyruvate, propyl pyruvate, methyl methoxypropionate, ethyl ethoxypropionate, n-methylpyrrolidone (NMP), 2-methoxyethyl ether (diglyme), ethylene glycol monomethyl ether, propylene glycol monomethyl ether, methyl propionate, ethyl propionate, ethyl ethoxy propionate, methylethyl ketone, cyclohexanone, 2-heptanone, cyclopentanone, ethyl 3-ethoxypropionate, propylene glycol methyl ether acetate (PGMEA), methylene cellosolve, 2-ethoxyethanol, N-methylformamide, N,N-dimethylformamide (DMF), N-methylformanilide, N-methylacetamide, N,N-dimethylacetamide, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, phenyl cellosolve acetate, or the like.

As one of ordinary skill in the art will recognize, the materials listed and described above as examples of materials that may be used for the solvent component of the photoresist underlayer composition are merely illustrative and are not intended to limit the embodiments. Rather, any suitable materials that dissolve the polymers and the photoacid generator may be used to help mix and apply the photoresist underlayer. All such materials are fully intended to be included within the scope of the embodiments.

In some embodiments, the method includes a first heating of the photoresist underlayer at a temperature of about 40° C. to about 300° C. for 10 seconds to 5 minutes to form a cross-linked photoresist underlayer composition 15*a*, as shown in FIG. 1C. The heating causes the crosslinking groups to cross-link. In some embodiments, the first heating is performed at a temperature of about 80° C. to about 200° C. for about 20 seconds to about 3 minutes. In other embodiments, the first heating is performed at a temperature of about 80° C. to about 300° C. for about 30 seconds to about 2 minutes.

A photoresist composition is subsequently disposed over the cross-linked photoresist underlayer composition 15*a* on the substrate 10 to form a photoresist layer 20, as shown in FIG. 1D. In some embodiments, the substrate 10 is rotated (spinned) during or after the photoresist layer 20 is deposited, spreading the photoresist composition across the surface of the cross-linked photoresist underlayer composition 15*a*.

The photoresist layer 20 is a photosensitive layer that is patterned by exposure to actinic radiation and development. The chemical properties of the photoresist regions struck by incident radiation change in a manner that depends on the type of photoresist used. Photoresist layers 20 are either positive tone resists or negative tone resists. A positive tone resist refers to a photoresist material that when exposed to radiation, such as UV light, becomes soluble in a developer, while the region of the photoresist that is non-exposed (or exposed less) is insoluble in the developer. A negative tone resist, on the other hand, refers to a photoresist material that when exposed to radiation becomes insoluble in the developer, while the region of the photoresist that is non-exposed (or exposed less) is soluble in the developer. The region of a negative resist that becomes insoluble upon exposure to radiation may become insoluble due to a cross-linking reaction caused by the exposure to radiation.

Whether a resist is a positive tone or negative tone may depend on the type of developer used to develop the resist. For example, some positive tone photoresists provide a positive pattern, (i.e.—the exposed regions are removed by the developer), when the developer is an aqueous-based developer, such as a tetramethylammonium hydroxide (TMAH) solution. On the other hand, the same photoresist provides a negative pattern (i.e.—the unexposed regions are removed by the developer) when the developer is an organic solvent. Further, in some negative tone photoresists developed with the TMAH solution, the unexposed regions of the photoresist are removed by the TMAH, and the exposed regions of the photoresist, that undergo cross-linking upon exposure to actinic radiation, remain on the substrate after development.

Photoresists according to the present disclosure include a polymer along with one or more photoactive compounds (PACs) in a solvent, in some embodiments. In some embodiments, the polymer includes a hydrocarbon structure (such as an alicyclic hydrocarbon structure) that contains one or more groups that will decompose (e.g., acid labile groups) or otherwise react when mixed with acids, bases, or free radicals generated by the PACs (as further described below). In some embodiments, the hydrocarbon structure includes a repeating unit that forms a skeletal backbone of the polymer resin. This repeating unit may include acrylic esters, methacrylic esters, crotonic esters, vinyl esters, maleic diesters, fumaric diesters, itaconic diesters, (meth) acrylonitrile, (meth) acrylamides, styrenes, vinyl ethers, combinations of these, or the like.

Specific structures that are utilized for the repeating unit of the hydrocarbon structure in some embodiments, include one or more of methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl (meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy) ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate, or the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether, or the like. Examples of styrenes include styrene, methyl styrene, dimethyl styrene, trimethyl styrene, ethyl styrene, isopropyl styrene, butyl styrene, methoxy styrene, butoxy styrene, acetoxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In some embodiments, the repeating unit of the hydrocarbon structure also has either a monocyclic or a polycyclic hydrocarbon structure substituted into it, or the monocyclic or polycyclic hydrocarbon structure is the repeating unit, in order to form an alicyclic hydrocarbon structure. Specific examples of monocyclic structures in some embodiments include bicycloalkane, tricycloalkane, tetracycloalkane, cyclopentane, cyclohexane, or the like. Specific examples of polycyclic structures in some embodiments include adamantane, norbornane, isobornane, tricyclodecane, tetracyclododecane, or the like.

The group which will decompose, otherwise known as a leaving group or, in some embodiments in which the PAC is a photoacid generator, an acid labile group (ALG), is attached to the hydrocarbon structure so that, it will react with the acids/bases/free radicals generated by the PACs during exposure. In some embodiments, the group which will decompose is a carboxylic acid group, a fluorinated alcohol group, a phenolic alcohol group, a sulfonic group, a sulfonamide group, a sulfonylimido group, an (alkylsulfonyl) (alkylcarbonyl) methylene group, an (alkylsulfonyl) (alkyl-carbonyl) imido group, a bis (alkylcarbonyl) methylene group, a bis (alkylcarbonyl) imido group, a bis (alkylsulfonyl) methylene group, a bis (alkylsulfonyl) imido group, a tris (alkylcarbonyl methylene group, a tris (alkylsulfonyl) methylene group, combinations of these, or the like. Specific groups that are used for the fluorinated alcohol group include fluorinated hydroxyalkyl groups, such as a hexafluoroisopropanol group in some embodiments. Specific groups that are used for the carboxylic acid group include acrylic acid groups, methacrylic acid groups, or the like. Examples of ALG on the polymer of the photoresist composition include those shown in FIG. 2C.

In some embodiments, the polymer also includes other groups attached to the hydrocarbon structure that help to improve a variety of properties of the polymerizable resin. For example, inclusion of a lactone group on the hydrocarbon structure assists to reduce the amount of line edge roughness after the photoresist has been developed, thereby helping to reduce the number of defects that occur during development. In some embodiments, the lactone groups include rings having five to seven members, although any suitable lactone structure may alternatively be used for the lactone group.

In some embodiments, the polymer includes groups that can assist in increasing the adhesiveness of the photoresist layer to underlying structures (e.g., substrate). Polar groups may be used to help increase the adhesiveness. Suitable polar groups include hydroxyl groups, cyano groups, or the like, although any suitable polar group may, alternatively, be used.

Optionally, the polymer includes one or more alicyclic hydrocarbon structures that do not contain a decomposable group in some embodiments. In some embodiments, the hydrocarbon structure that does not contain a group which will decompose includes structures such as 1-adamantyl (meth)acrylate, tricyclodecanyl (meth)acrylate, cyclohexyl (methacrylate), combinations of these, or the like.

In some embodiments, the polymer in the photoresist composition is a polyhydroxystyrene, polyacrylate, or polymethylmethacrylate based polymer.

Additionally, some embodiments of the photoresist include one or more photoactive compounds (PACs). The PACs are photoactive components, such as photoacid generators, photobase generators, free-radical generators, or the like. In some embodiments in which the PACs are a photoacid generator, the PACs include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyamine-sulfonates, imidesulfonates, ketodiazosulfones, sulfonyldiazoesters, 1,2-di(arylsulfonyl) hydrazines, nitrobenzyl esters, and the s-triazine derivatives, combinations of these, or the like.

Specific examples of photoacid generators include α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like. Structures of photoacid generators according to some embodiments of the disclosure are shown in FIG. 5.

In some embodiments in which the PACs are free-radical generators, the PACs include n-phenylglycine; aromatic ketones, including benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis (dimethylamino) benzo-phenone, p,p'-bis (diethylamino)-benzophenone; anthraquinone, 2-ethylanthraquinone; naphthaquinone; and phenanthraquinone; benzoins including benzoin, benzoinmethylether, benzoinisopropylether, benzoin-n-butylether, benzoin-phenylether, methylbenzoin and ethylbenzoin; benzyl derivatives, including dibenzyl, benzyldiphenyldisulfide, and benzyldimethylketal; acridine derivatives, including 9-phenylacridine, and 1,7-bis (9-acridinyl) heptane; thioxanthones, including 2-chlorothioxanthone, 2-methylthioxanthone, 2,4-diethylthioxanthone, 2,4-dimethylthioxanthone, and 2-isopropylthioxanthone; acetophenones, including 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone; 2,4,5-triarylimidazole dimers, including 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer; combinations of these, or the like.

In some embodiments in which the PACs are photobase generators, the PACs includes quaternary ammonium dithiocarbamates, α aminoketones, oxime-urethane containing molecules such as dibenzophenoneoxime hexamethylene diurethan, ammonium tetraorganylborate salts, and N-(2-nitrobenzyloxycarbonyl) cyclic amines, combinations of these, or the like.

As one of ordinary skill in the art will recognize, the chemical compounds listed herein are merely intended as illustrated examples of the PACs and are not intended to limit the embodiments to only those PACs specifically described. Rather, any suitable PAC may be used, and all such PACs are fully intended to be included within the scope of the present embodiments.

In some embodiments, a cross-linking agent is added to the photoresist composition. The cross-linking agent reacts with one group from one of the hydrocarbon structures in the polymer resin and also reacts with a second group from a separate one of the hydrocarbon structures in order to cross-link and bond the two hydrocarbon structures together. This bonding and cross-linking increases the molecular weight of the polymer products of the cross-linking reaction and increases the overall linking density of the photoresist. Such an increase in density and linking density helps to improve the resist pattern.

In some embodiments the cross-linking agent has the following structure:

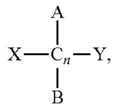

wherein C is carbon, n ranges from 1 to 15; A and B independently include a hydrogen atom, a hydroxyl group, a halide, an aromatic carbon ring, or a straight or cyclic alkyl, alkoxyl/fluoro, alkyl/fluoroalkoxyl chain having a carbon number of between 1 and 12, and each carbon C contains A and B; a first terminal carbon C at a first end of a carbon C chain includes X and a second terminal carbon C at a second end of the carbon chain includes Y, wherein X and Y independently include an amine group, a thiol group, a hydroxyl group, an isopropyl alcohol group, or an isopropyl amine group, except when n=1 then X and Y are bonded to the same carbon C. Specific examples of materials that may be used as the cross-linking agent include the following:

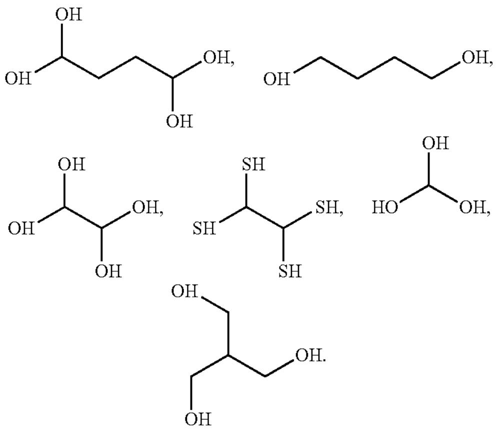

Alternatively, instead of or in addition to the cross-linking agent being added to the photoresist composition, a coupling reagent is added in some embodiments, in which the coupling reagent is added in addition to the cross-linking agent. The coupling reagent assists the cross-linking reaction by reacting with the groups on the hydrocarbon structure in the polymer resin before the cross-linking reagent, allowing for a reduction in the reaction energy of the cross-linking reaction and an increase in the rate of reaction. The bonded coupling reagent then reacts with the cross-linking agent, thereby coupling the cross-linking agent to the polymer resin.

Alternatively, in some embodiments in which the coupling reagent is added to the photoresist without the cross-linking agent, the coupling reagent is used to couple one group from one of the hydrocarbon structures in the polymer to a second group from a separate one of the hydrocarbon structures in order to cross-link and bond the two polymers together. However, in such an embodiment the coupling reagent, unlike the cross-linking agent, does not remain as part of the polymer, and only assists in bonding one hydrocarbon structure directly to another hydrocarbon structure.

In some embodiments, the coupling reagent has the following structure:

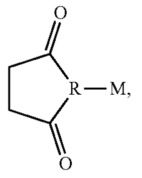

where R is a carbon atom, a nitrogen atom, a sulfur atom, or an oxygen atom; M includes a chlorine atom, a bromine atom, an iodine atom, —$NO_2$; —$SO_3$—; —H—; —CN; —NCO, —OCN; —$CO_2$—; —OH; —OR*, —OC(O)CR*; —SR, —$SO_2N(R^*)_2$; —$SO_2R^*$; SOR; —OC(O)R*; —C(O)OR*; —C(O)R*; —$Si(OR^*)_3$; —$Si(R^*)_3$; epoxy groups, or the like; and R* is a substituted or unsubstituted C1-C12 alkyl, C1-C12 aryl, C1-C12 aralkyl, or the like. Specific examples of materials used as the coupling reagent in some embodiments include the following:

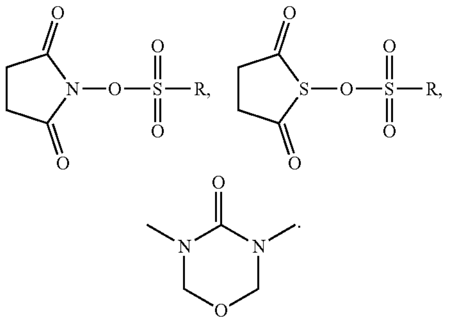

Some embodiments of the photoresist are metal-containing photoresists. In some embodiments, the metal-containing photoresist forms a metal-containing photoresist layer. The metals in the metal-containing photoresist includes one or more of Cs, Ba, La, Ce, In, Sn, or Ag in some embodiments.

In some embodiments, the metal-containing photoresist includes metal oxide nanoparticles. The metal oxides nanoparticles are selected from the group consisting of titanium dioxide, zinc oxide, zirconium dioxide, nickel oxide, cobalt oxide, manganese oxide, copper oxides, iron oxides, strontium titanate, tungsten oxides, vanadium oxides, chromium oxides, tin oxides, hafnium oxide, indium oxide, cadmium oxide, molybdenum oxide, tantalum oxides, niobium oxide, aluminum oxide, and combinations thereof in some embodiments. As used herein, nanoparticles are particles having an average particle size between 1 and 10 nm. In some embodiments, the metal oxide nanoparticles have an average particle size between 2 and 5 nm. In some embodiments, the amount of metal oxide nanoparticles in the photoresist composition ranges from about 1 wt. % to about 10 wt. % based on the total weight of the photoresist composition. In some embodiments, metal oxide nanoparticle concentrations below 1 wt. % provide photoresist layers that are too thin, and metal oxide nanoparticle concentrations greater than about 10 wt. % provide a photoresist composition that is too viscous and that will be difficult to provide a photoresist coating of uniform thickness on the substrate.

In some embodiments, the metal oxide nanoparticles are complexed with carboxylic acid or sulfonic acid ligands. For example, in some embodiments, zirconium oxide or hafnium oxide nanoparticles are complexed with methacrylic acid forming hafnium methacrylic acid (HfMAA) or zirconium methacrylic acid (ZrMAA). In some embodiments, the HfMAA or ZrMAA are dissolved at about a 5 wt. % to about 10 wt. % weight range in a coating solvent, such as propylene glycol methyl ether acetate (PGMEA). In some embodiments, about 1 wt. % to about 10 wt. % of a photoactive compound (PAC) based on the total weight of the photoresist composition to form a metal oxide resist.

The individual components of the photoresist composition are placed into a solvent in order to aid in the mixing and dispensing of the photoresist. To aid in the mixing and dispensing of the photoresist, the solvent is chosen at least in part based upon the materials chosen for the polymers as well as the PAC. In some embodiments, the solvent is chosen such that the polymers and the PAC can be evenly dissolved into the solvent and dispensed upon the layer to be patterned.

In some embodiments, the solvent is an organic solvent, and includes one or more of any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the solvent for the photoresist underlayer composition include, acetone, methanol, ethanol, propanol, isopropanol (IPA), n-butanol, toluene, xylene, 4-hydroxy-4-methyl-2-pentatone, tetrahydrofuran (THF), methyl ethyl ketone, cyclohexanone (CHN), methyl isoamyl ketone, 2-heptanone (MAK), ethylene glycol, 1-ethoxy-2-propanol, methyl isobutyl carbinol (MIBC), ethylene glycol monoacetate, ethylene glycol dimethyl ether, ethylene glycol dimethyl ether, ethylene glycol methylethyl ether, ethylene glycol monoethyl ether, methyl cellosolve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, diethethylene glycol monoethyl ether, diethylene glycol monobutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, methyl acetate, ethyl acetate, propyl acetate, n-butyl acetate (nBA), methyl lactate, ethyl lactate (EL), propyl lactate, butyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, propylene glycol methyl ether acetate, propylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, ethyl 3-ethoxypropionate, methyl 3-methoxypropionate, methyl 3-ethoxypropionate, and ethyl 3-methoxypropionate, β-propiolactone, β-butyrolactone, γ-butyrolactone (GBL), α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, propylene carbonate, vinylene carbonate, ethylene carbonate, butylene carbonate, acetate-2-methoxyethyl, acetate-2-ethoxyethyl, acetate-2-(2-ethoxyethoxy) ethyl, acetate-3-methoxy-3-methylbutyl, acetate-1-methoxy-2-propyl, dipropylene glycol, monomethylether, monoethylether, monopropylether, monobutylether, monophenylether, dipropylene glycol monoacetate, dioxane, methyl pyruvate, ethyl pyruvate, propyl pyruvate, methyl methoxypropionate, ethyl ethoxypropionate, n-methylpyrrolidone (NMP), 2-methoxyethyl ether (diglyme), ethylene glycol monomethyl ether, propylene glycol monomethyl ether, methyl propionate, ethyl propionate, ethyl ethoxy propionate, methylethyl ketone, cyclohexanone, 2-heptanone, cyclopentanone, cyclohexanone, ethyl 3-ethoxypropionate, propylene glycol methyl ether acetate (PGMEA), methylene cellosolve, 2-ethoxyethanol, N-methylformamide, N,N-dimethylformamide (DMF), N-methylformanilide, N-methylacetamide, N,N-dimethylacetamide, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, phenyl cellosolve acetate, or the like.

As one of ordinary skill in the art will recognize, the materials listed and described above as examples of materials that may be used for the solvent component of the photoresist composition are merely illustrative and are not intended to limit the embodiments. Rather, any suitable materials that dissolve the polymer and the photoacid generator may be used to help mix and apply the photoresist underlayer. All such materials are fully intended to be included within the scope of the embodiments.

In some embodiments, the method includes a second heating of the photoresist underlayer 15*a* and the photoresist layer 20 at a temperature of about 40° C. to about 140° C. for 10 seconds to 5 minutes after the photoresist layer 20 is disposed over the photoresist underlayer 15*a*, as shown in FIG. 1E. The second heating removes solvent from the photoresist layer 20. In some embodiments, the photoresist layer 20 and the photoresist underlayer 15 are heated at a temperature of about 60° C. to about 120° C. for 20 seconds to 3 minutes.

Figure 1G:
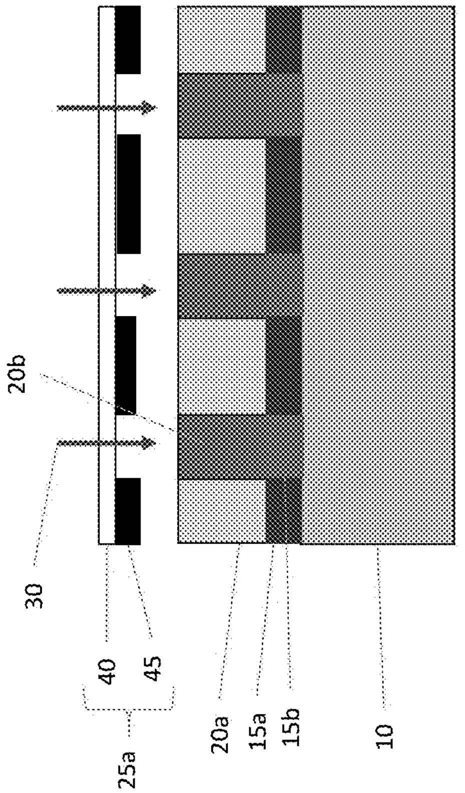
Figure 1H:
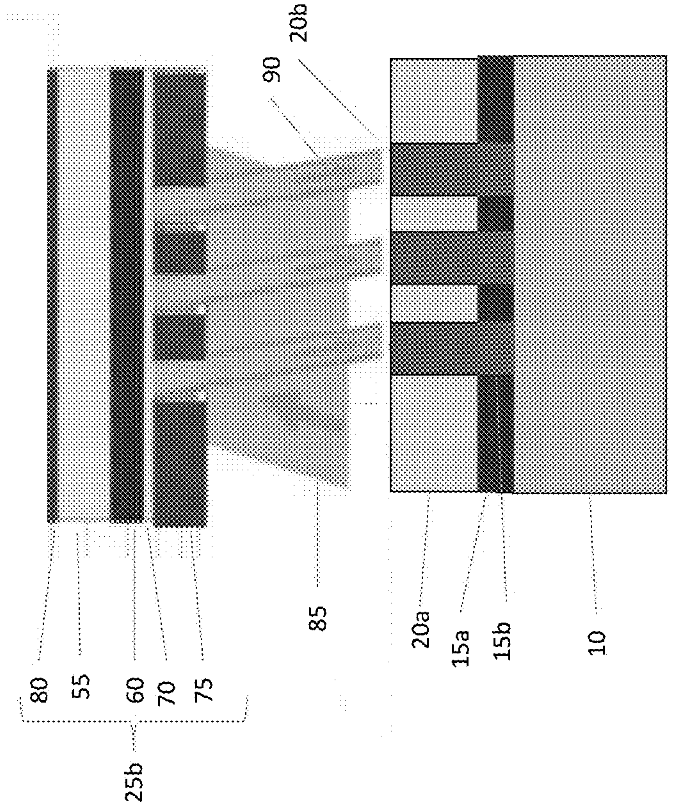

Then, as shown in FIG. 1F, a portion of the photoresist layer 20*b* is selectively exposed to actinic radiation 30. In some embodiments, a mask 25 is used to form exposed portions 20*b* and unexposed portions 20*a* of the photoresist layer, and exposed portions 15*b* and unexposed portions 15*a* of the photoresist underlayer. FIGS. 1G and 1H are detailed illustrations showing the selective exposures of the photoresist layer 20 to form the exposed portions 20*b* and unexposed portions 20*a*. In some embodiments, the exposure to radiation is carried out by placing the photoresist-coated substrate in a photolithography tool. The photolithography tool includes a photomask 25*a*, 25*b*, optics, an exposure radiation source to provide the radiation 30/90 for exposure, and a movable stage for supporting and moving the substrate under the exposure radiation.

In some embodiments, the radiation source (not shown) supplies radiation 30/90, such as ultraviolet light, to the photoresist layer 20 in order to induce a reaction of the photoactive compounds in the photoresist, which in turn reacts with the polymer in the photoresist to chemically alter those regions of the photoresist layer 20*b* to which the radiation 30/90 impinges. In some embodiments, the photoresist layer 20 is selectively exposed to ultraviolet radiation. In some embodiments, the ultraviolet radiation is deep ultraviolet radiation (DUV). In some embodiments, the ultraviolet radiation is extreme ultraviolet (EUV) radiation. In some embodiments, the actinic radiation is an electron beam. In some embodiments, the radiation is electromagnetic radiation, such as g-line (wavelength of about 436 nm), i-line (wavelength of about 365 nm), ultraviolet radiation, far ultraviolet radiation, extreme ultraviolet, electron beams, or the like. In some embodiments, the radiation source is selected from the group consisting of a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm), or a $CO_2$ laser-excited Sn plasma (extreme ultraviolet, wavelength of 13.5 nm).

As shown in FIG. 1G, the exposure radiation 30 passes through a photomask 25*a* before irradiating the photoresist layer 20 in some embodiments. In some embodiments, the photomask has a pattern to be replicated in the photoresist layer 20. The pattern is formed by an opaque pattern 45 on the photomask substrate 40, in some embodiments. The opaque pattern 45 may be formed by a material opaque to ultraviolet radiation, such as chromium, while the photomask substrate 40 is formed of a material that is transparent to ultraviolet radiation, such as fused quartz.

In some embodiments, the selective exposure of the photoresist layer 20 to form exposed regions 20*b* and unexposed regions 20*a* is performed using extreme ultraviolet lithography. In an extreme ultraviolet lithography operation, a reflective photomask 25*b* is used to form the patterned exposure light in some embodiments, as shown in FIG. 1H. The reflective photomask 25*b* includes a low thermal expansion glass substrate 55, on which a reflective multilayer 60 of Si and Mo is formed. A capping layer 70 and absorber layer 75 are formed on the reflective multilayer 55. A rear conductive layer 80 is formed on the back side of the low thermal expansion substrate 55. In extreme ultraviolet lithography, extreme ultraviolet radiation 85 is directed towards the reflective photomask 25*b* at an incident angle of about 6°. A portion 90 of the extreme ultraviolet radiation is reflected by the Si/Mo multilayer 55 towards the photoresist coated substrate 10, while the portion of the extreme ultraviolet radiation incident upon the absorber layer 75 is absorbed by the photomask. In some embodiments, additional optics, including mirrors, are between the reflective photomask 25*b* and the photoresist coated substrate.

In an embodiment, the patterned radiation 30/90 is extreme ultraviolet light having a 13.5 nm wavelength, the photoactive compound (PAC) is a photoacid generator, the group to be decomposed is an ALG pendant to the hydrocarbon main chain structure of the polymer. In some embodiments, a cross linking agent is used. The patterned radiation 30/90 impinges upon the photoacid generator and the photoacid generator absorbs the impinging patterned radiation 30/90. This absorption initiates the photoacid generator to generate a proton (e.g., a $H^+$ atom) within the photoresist layer 20*b* and the photoresist underlayer 15*b*. When the proton impacts the ALG on the hydrocarbon structure, the proton reacts with the ALG, chemically altering the ALG and altering the properties of the polymer in general. The acid generated by the photoacid generator in the photoresist underlayer 15 cleaves the ALG on polymer with the pendant ALG, thereby increasing the polymer's solubility in the developer.

In some embodiments, the acids generated during the exposure to actinic radiation cleave ALGs on the crosslinked polymers in the photoresist underlayer 15*b* causing the polymers in the photoresist underlayer to de-crosslink, and increasing the solubility of the photoresist underlayer 15*b* in a subsequently applied developer solution. In some embodiments, the ALG and the crosslinking group are on the same pendant side chain of the polymer. The cleaving of the ALG in this embodiment also de-crosslinks the crosslinked polymers.

In some embodiments, the exposure of the photoresist layer 20 uses an immersion lithography technique. In such a technique, an immersion medium (not shown) is placed between the final optics and the photoresist layer 20, and the exposure radiation 30 passes through the immersion medium.

As a result of the operation in FIG. 1F, 1G, or 1H, a latent pattern is formed in the resist layer 20. The latent pattern of the photoresist layer refers to the exposed pattern in the photoresist layer 20, which eventually becomes a physical resist pattern, such as by a developing operation. The latent pattern of the resist layer 20 includes unexposed portions 20*a* and exposed portions 20*b*. In an embodiment using a chemically amplified (CA) resist material with a PAG, acids are generated in the exposed portions 20*b* during the exposure process. In the latent pattern, the exposed portions 20*b*, 15*b* of the photoresist layer 20 and photoresist underlayer 15 are physically or chemically changed. In some examples, the exposed portions 20*b*, 15*b* are de-protected, inducing a polarity change for dual-tone imaging (developing).

The selectively exposed photoresist layer 20 and photoresist underlayer 15 are then subjected to a third heating in some embodiments, as shown in FIG. 1I. A third heating of the photoresist underlayer and the selectively exposed photoresist layer, also known as a post-exposure baking (PEB) operation, is performed at a temperature of about 80° C. to about 300° C. for about 10 seconds to about 10 minutes. In some embodiments, the PEB is performed at a temperature of about 100° C. to about 200° C. for about 10 seconds to about 10 minutes. During the PEB operation, more acid is generated in the exposed portions 20*b*, 15*b* of the photoresist layer and the photoresist underlayer. The generated acid furthers the chemical changes in the photoresist layer and photoresist underlayer. In some embodiments, crosslinking occurs in the photoresist layer 20 during the PEB. In some embodiments, the PEB heating temperature is in a range of about 130° C. to about 170° C. for about 30 seconds to about 5 minutes.

Development is subsequently performed, as shown in FIG. 1J, using a solvent, to form a pattern 35 in the photoresist layer and photoresist underlayer. In some embodiments where positive tone development is desired, a positive tone developer such as a basic aqueous solution is used to remove the radiation exposed regions 20*b*, 15*b* of the photoresist layer and photoresist underlayer. In some embodiments, the positive tone developer includes one or more selected from tetramethylammonium hydroxide (TMAH), tetrabutylammonium hydroxide, sodium hydroxide, potassium hydroxide, sodium carbonate, sodium bicarbonate, sodium silicate, sodium metasilicate, aqueous ammonia, monomethylamine, dimethylamine, trimethylamine, monoethylamine, diethylamine, triethylamine, monoisopropylamine, diisopropylamine, triisopropylamine, monobutylamine, dibutylamine, monoethanolamine, diethanolamine, triethanolamine, dimethylaminoethanol, diethylaminoethanol, ammonia, caustic soda, caustic potash, potassium metasilicate, tetraethylammonium hydroxide, combinations of these, or the like.

In some embodiments, the developer is applied to the photoresist layer using a spin-on process. In the spin-on process, the developer is applied to the photoresist layer by a dispenser from above while the coated substrate is rotated. The developer is selected so that it removes the exposed portions 20*b*, 15*b* of the photoresist layer and the photoresist underlayer in some embodiments. In some embodiments, the developer is supplied at a rate of between about 5 ml/min and about 800 ml/min, while the coated substrate is rotated at a speed of between about 100 rpm and about 2000 rpm. In some embodiments, the developer is at a temperature of between about 10° C. and about 80° C. The development operation continues for between about 30 seconds to about 10 minutes in some embodiments.

While the spin-on operation is one suitable method for developing the photoresist layer and photoresist underlayer after exposure, it is intended to be illustrative and is not intended to limit the embodiment. Rather, any suitable development operations, including dip processes, puddle processes, and spray-on methods, may alternatively be used. All such development operations are included within the scope of the embodiments.

In some embodiments, the high solubility of the exposed portions 15*b* of the photoresist underlayer in the developer due to the de-crosslinking caused by the cleaving of the ALG provides improved resolution of the photoresist patterns because photoresist residue and scum on the photoresist underlayer is removed along with the underlying photoresist underlayer during the developing operation.

Additional processing is performed while the patterned photoresist layer is in place in some embodiments. For example, an etching operation, using dry or wet etching, is performed in some embodiments, to transfer the pattern 35 of the photoresist layer to the substrate 10, thereby forming pattern 35' in the substrate. The remaining photoresist layer is subsequently removed by a suitable photoresist stripping or photoresist ashing operation, as shown in FIG. 1K. In some embodiments, the portion 15*a* of the photoresist underlayer not exposed to actinic radiation remains on the substrate 10, as shown in FIG. 1K. In some embodiments, the unexposed portions 15*a* of the photoresist underlayer are removed during the photoresist stripping, photoresist ashing, or substrate etching operation.

Figures 9A, 9B, 9C, 9D, 9E, 9F, 9G, 9H:
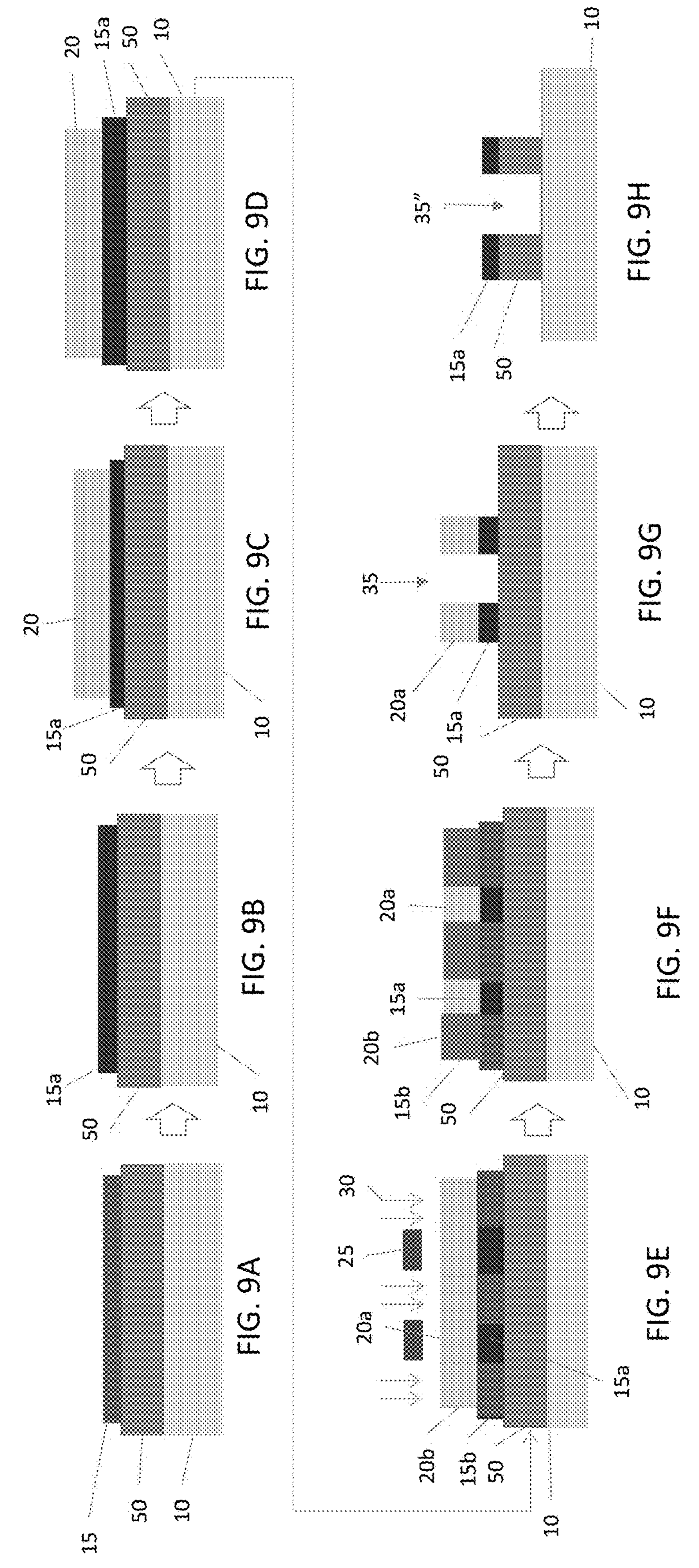
FIGS. 9A, 9B, 9C, 9D, 9E, 9F, 9G, and 9H show process stages of a sequential operation according to embodiments of the disclosure.

FIGS. 9A-9H are cross sectional views of an alternative embodiment of manufacturing a semiconductor device according to the disclosure. FIG. 9A illustrates a semiconductor substrate 10 with a layer to be patterned 50 disposed thereon, and the photoresist underlayer 15 disposed over the layer to be patterned 50. In some embodiments, the layer to be patterned 50 is a hard mask layer; metallization layer; or a dielectric layer, such as a passivation layer, disposed over a metallization layer. In embodiments where the layer to be patterned 50 is a metallization layer, the layer to be patterned 50 is formed of a conductive material using metallization processes, and metal deposition techniques, including chemical vapor deposition, atomic layer deposition, and physical vapor deposition (sputtering). Likewise, if the layer to be patterned 50 is a dielectric layer, the layer to be patterned 50 is formed by dielectric layer formation techniques, including thermal oxidation, chemical vapor deposition, atomic layer deposition, and physical vapor deposition.

The substrate 10 with the layer to be patterned 50 disposed thereon, is subsequently processed in a similar manner as discussed herein with reference to FIGS. 1A to 1J. For example, the photoresist underlayer 15 undergoes a first heating to form a crosslinked photoresist underlayer 15*a*, as shown in FIG. 9B, and discussed herein in reference to FIG. 1C. Then a photoresist layer 20 is formed over the crosslinked photoresist underlayer 15*a*, as shown in FIG. 9C, and discussed herein in reference to FIG. 1D. The photoresist layer 20 subsequently undergoes a heating operation to drive off solvents in some embodiments, as shown in FIG. 9D, and discussed herein in reference to FIG. 1E. Next, the photoresist layer 20 and photoresist underlayer 15*a* are selectively exposed to actinic radiation, as shown in FIG. 9E, and discussed herein in reference to FIGS. 1F, 1G, and 1H. The selectively exposed photoresist layer 20*a*, 20*b* and photoresist underlayer 15*a*, 15*b* then undergoes a post exposure baking operation, as shown in FIG. 9F, and discussed herein in reference to FIG. 1I. Then photoresist layer 20*a*, 20*b* and photoresist underlayer 15*a*, 15*b* are developed to form a photoresist layer/underlayer pattern 35, as shown in FIG. 9G, and discussed herein in reference to FIG. 1J. The layer to be patterned 50 is then etched using the photoresist layer/underlayer pattern 35 as an etch mask to form a pattern 35" in the layer to be patterned 50, as shown in FIG. 9H. The layer to be patterned 50 may be etched by wet or dry etching depending on the materials to be etched and the desired configuration of the pattern 35". The remaining photoresist layer is subsequently removed by a suitable photoresist stripping or photoresist ashing operation, as shown in FIG. 9H. In some embodiments, the portion 15*a* of the photoresist underlayer not exposed to actinic radiation remains on the substrate 10, as shown in FIG. 9H. In some embodiments, the unexposed portions 15*a* of the photoresist underlayer are removed during the photoresist stripping, photoresist ashing, or substrate etching operation.

Figures 10A, 10B, 10C, 10D, 10E, 10F, 10G, 10H, 10I:
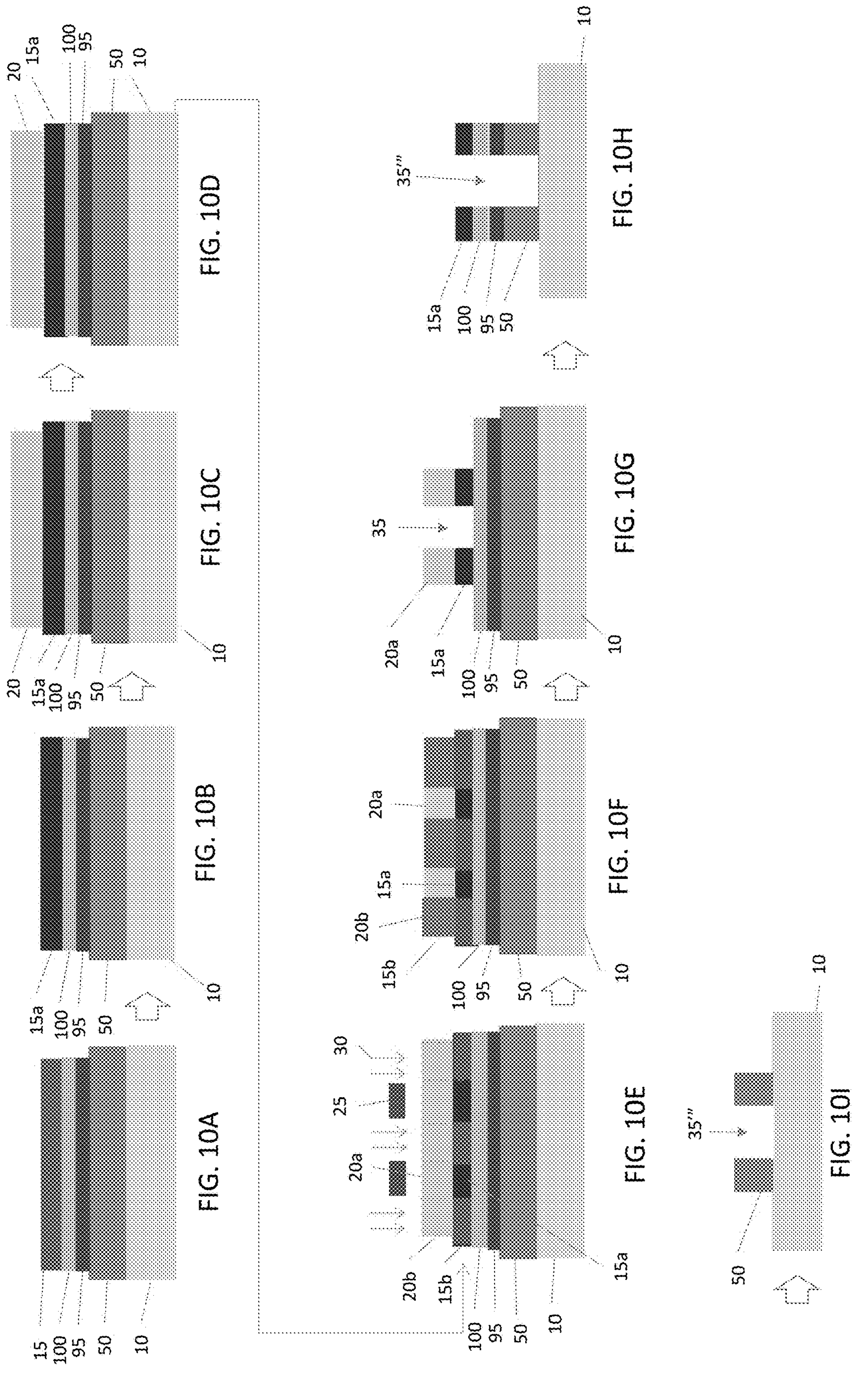
FIGS. 10A, 10B, 10C, 10D, 10E, 10F, 10G, 10H, and 10I show process stages of a sequential operation according to embodiments of the disclosure.

FIGS. 10A-10I are cross sectional views of an alternative embodiment of manufacturing a semiconductor device according to the disclosure. FIG. 10A illustrates a mid-layer 100 and bottom layer 95 of a tri-layer resist photoresist disposed over the substrate 10. A tri-layer photoresist includes a bottom layer, a middle layer, and a top layer. In some embodiments, the top layer is a photoresist layer. A layer to patterned 50, as discussed in reference to FIG. 9A, is disposed over the substrate 10 in some embodiments.

In some embodiments, the bottom layer 95 is an organic material having a substantially planar upper surface, and the middle layer 100 is an anti-reflective layer. In some embodiments, the organic material of the bottom layer 95 includes a plurality of monomers or polymers that are not crosslinked. In some embodiments, the bottom layer 95 contains a material that is patternable and/or has a composition tuned to provide anti-reflection properties. Exemplary materials for the bottom layer 95 include carbon backbone polymers. The bottom layer 95 is used to planarize the structure, as the underlying structure may be uneven depending on the structure of devices in an underlying device layer. In some embodiments, the bottom layer 95 is formed by a spin coating process. In certain embodiments, the thickness of the bottom layer 95 ranges from about 50 nm to about 500 nm.

The middle layer 100 of the trilayer resist structure may have a composition that provides anti-reflective properties for the photolithography operation and/or hard mask properties. In some embodiments, the middle layer 100 includes a silicon-containing layer (e.g., a silicon hard mask material). The middle layer 100 may include a silicon-containing inorganic polymer. In other embodiments, the middle layer 100 includes a siloxane polymer. In other embodiments, the middle layer 100 includes silicon oxide (e.g., spin-on glass (SOG)), silicon nitride, silicon oxynitride, polycrystalline silicon, a metal-containing organic polymer material that contains metal such as titanium, titanium nitride, aluminum, and/or tantalum; and/or other suitable materials. The middle layer 100 may be bonded to adjacent layers, such as by covalent bonding, hydrogen bonding, or hydrophilic-to-hydrophilic forces.

In some embodiments, the photoresist underlayer 15 of the present disclosure is disposed over the mid-layer 100 of the tri-layer resist, as shown in FIG. 10A, and discussed herein in reference to FIGS. 1A and 1B. The photoresist underlayer 20 is heated to form a crosslinked photoresist layer, as shown in FIG. 10B, and discussed herein in reference to FIG. 1C.

The photoresist layer 20 is formed over the crosslinked photoresist underlayer **15*a* in some embodiments, as shown in FIG. 10C, and discussed herein in reference to FIG. 1C. The photoresist layer 20 subsequently undergoes a heating operation to drive off solvents in some embodiments, as shown in FIG. 10D, and discussed herein in reference to FIG. 1D. Next, the photoresist layer 20 and photoresist underlayer 15*a* are selectively exposed to actinic radiation, as shown in FIG. 10E, and discussed herein in reference to FIGS. 1F, 1G, and 1H. The selectively exposed photoresist layer 20*a*, 20*b* and photoresist underlayer 15*a*, 15*b* then undergo a post exposure baking operation, as shown in FIG. 10F, and discussed herein in reference to FIG. 1I. Then photoresist layer 20*a*, 20*b* and photoresist underlayer 15*a*, 15*b* are developed to form a photoresist layer/underlayer pattern 35, as shown in FIG. 10G, and discussed herein in reference to FIG. 1J. The pattern 35 is extended into the middle layer 100 and bottom layer 95, and then into the layer to be patterned 50 in some embodiments. The middle layer, bottom layer, and layer to be patterned 50 are etched using the trilayer resist layer/underlayer pattern 35 as an etch mask to form a pattern 35''' in the layer to be patterned 50 in some embodiments, as shown in FIG. 10H. The middle layer 100, bottom layer 95, and layer to be patterned 50 may be etched by wet or dry etching depending on the materials to be etched and the desired configuration of the pattern 35'''. The remaining photoresist layer is subsequently removed by a suitable photoresist stripping or photoresist ashing operation, as shown in FIG. 10H. In some embodiments, the portion 15*a* of the photoresist underlayer not exposed to actinic radiation, the middle layer 100, and bottom layer 95 are removed during the photoresist stripping, photoresist ashing, or substrate etching operation, as shown in FIG. 10I. In some embodiments, different etching operations are performed to remove each of the unexposed portion 15*a* of the photoresist underlayer, middle layer 100, and bottom layer 95**.

In addition to the polymers, the PACs, the solvents, the cross-linking agent, and the coupling reagent, some embodiments of the photoresist also include a number of other additives that assist the photoresist to obtain high resolution. For example, some embodiments of the photoresist also include surfactants in order to help improve the ability of the photoresist to coat the surface on which it is applied. In some embodiments, the surfactants include nonionic surfactants, polymers having fluorinated aliphatic groups, surfactants that contain at least one fluorine atom and/or at least one silicon atom, polyoxyethylene alkyl ethers, polyoxyethylene alkyl aryl ethers, polyoxyethylene-polyoxypropylene block copolymers, sorbitan fatty acid esters, and polyoxyethylene sorbitan fatty acid esters.

Specific examples of materials used as surfactants in some embodiments include polyoxyethylene lauryl ether, polyoxyethylene stearyl ether, polyoxyethylene cetyl ether, polyoxyethylene oleyl ether, polyoxyethylene octyl phenol ether, polyoxyethylene nonyl phenol ether, sorbitan monolaurate, sorbitan monopalmitate, sorbitan monostearate, sorbitan monooleate, sorbitan trioleate, sorbitan tristearate, polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, polyethylene glycol distearate, polyethylene glycol dilaurate, polyethylene glycol, polypropylene glycol, polyoxyethylenestearyl ether, polyoxyethylene cetyl ether, fluorine containing cationic surfactants, fluorine containing nonionic surfactants, fluorine containing anionic surfactants, cationic surfactants and anionic surfactants, combinations thereof, or the like.

Another additive added to some embodiments of the photoresist composition is a quencher, which inhibits diffusion of the generated acids/bases/free radicals within the photoresist. The quencher improves the resist pattern configuration as well as the stability of the photoresist over time. In an embodiment, the quencher is an amine, such as a second lower aliphatic amine, a tertiary lower aliphatic amine, or the like. Specific examples of amines include trimethylamine, diethylamine, triethylamine, di-n-propylamine, tri-n-propylamine, tripentylamine, diethanolamine, and triethanolamine, alkanolamine, combinations thereof, or the like.

In some embodiments, an organic acid is used as the quencher. Specific embodiments of organic acids include malonic acid, citric acid, malic acid, succinic acid, benzoic acid, salicylic acid; phosphorous oxo acid and its derivatives, such as phosphoric acid and derivatives thereof such as its esters, phosphoric acid di-n-butyl ester and phosphoric acid diphenyl ester; phosphonic acid and derivatives thereof such as its ester, such as phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof such as its esters, including phenylphosphinic acid.

Another additive added to some embodiments of the photoresist is a stabilizer, which assists in preventing undesired diffusion of the acids generated during exposure of the photoresist. In some embodiments, the stabilizer includes nitrogenous compounds, including aliphatic primary, secondary, and tertiary amines; cyclic amines, including piperidines, pyrrolidines, morpholines; aromatic heterocycles, including pyridines, pyrimidines, purines; imines, including diazabicycloundecene, guanidines, imides, amides, or the like. Alternatively, ammonium salts are also used for the stabilizer in some embodiments, including primary, secondary, tertiary, and quaternary alkyl- and aryl-ammonium salts of alkoxides, including hydroxide, phenolates, carboxylates, aryl and alkyl sulfonates, sulfonamides, or the like. Other cationic nitrogenous compounds, including pyridinium salts and salts of other heterocyclic nitrogenous compounds with anions, such as alkoxides, including hydroxide, phenolates, carboxylates, aryl and alkyl sulfonates, sulfonamides, or the like, are used in some embodiments.

Another additive in some embodiments of the photoresist is a dissolution inhibitor to help control dissolution of the photoresist during development. In an embodiment bile-salt esters may be utilized as the dissolution inhibitor. Specific examples of dissolution inhibitors in some embodiments include cholic acid, deoxycholic acid, lithocholic acid, t-butyl deoxycholate, t-butyl lithocholate, and t-butyl-3-acetyl lithocholate.

A coloring agent is another additive included in some embodiments of the photoresist. The coloring agent aids observers in examining the photoresist to find any defects that may need to be remedied prior to further processing. In some embodiments, the coloring agent is a triarylmethane dye or a fine particle organic pigment. Specific examples of materials in some embodiments include crystal violet, methyl violet, ethyl violet, oil blue #603, Victoria Pure Blue BOH, malachite green, diamond green, phthalocyanine pigments, azo pigments, carbon black, titanium oxide, brilliant green dye (C. I. 42020), Victoria Pure Blue FGA (Linebrow), Victoria BO (Linebrow) (C. I. 42595), Victoria Blue BO (C. I. 44045), rhodamine 6G (C. I. 45160), benzophenone compounds, such as 2,4-dihydroxybenzophenone and 2,2',4,4'-tetrahydroxybenzophenone; salicylic acid compounds, such as phenyl salicylate and 4-t-butylphenyl salicylate; phenylacrylate compounds, such as ethyl-2-cyano-3,3-diphenylacrylate, and 2'-ethylhexyl-2-cyano-3,3-diphenylacrylate; benzotriazole compounds, such as 2-(2-hydroxy-5-methylphenyl)-2H-benzotriazole, and 2-(3-t-butyl-2-hydroxy-5-methylphenyl)-5-chloro-2H-benzotriazole; coumarin compounds, such as 4-methyl-7-diethylamino-1-benzopyran-2-one; thioxanthone compounds, such as diethylthioxanthone; stilbene compounds, naphthalic acid compounds, azo dyes, phthalocyanine blue, phthalocyanine green, iodine green, Victoria blue, naphthalene black, Photopia methyl violet, bromphenol blue and bromcresol green; laser dyes, such as Rhodamine G6, Coumarin 500, DCM (4-(dicyanomethylene)-2-methyl-6-(4-dimethylaminostyryl)-4H pyran)), Kiton Red 620, Pyrromethene 580, or the like. Additionally, one or more coloring agents may be used in combination to provide the desired coloring.

Surface leveling agents are added to some embodiments of the photoresist to assist a top surface of the photoresist to be level, so that impinging light will not be adversely modified by an unlevel surface. In some embodiments, surface leveling agents include fluoroaliphatic esters, hydroxyl terminated fluorinated polyethers, fluorinated ethylene glycol polymers, silicones, acrylic polymer leveling agents, combinations thereof, or the like.

Additional processing operations are performed in some embodiments to manufacture semiconductor devices. In some embodiments, the fabrication process includes an ion implantation process applied to the wafer using the patterned resist layer as an implantation mask, thereby forming various doped features in the wafer.

Other embodiments include other operations before, during, or after the operations described above. In an embodiment, the method includes forming fin field effect transistor (FinFET) structures. In some embodiments, a plurality of active fins are formed on the semiconductor substrate. Such embodiments, further include etching the substrate through the openings of the patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In another embodiment, the method includes other operations to form a plurality of gate electrodes on the semiconductor substrate. The method may further include forming gate spacers, doped source/drain regions, contacts for gate/source/drain features, etc. In another embodiment, a target pattern is to be formed as metal lines in a multilayer interconnection structure. For example, the metal lines may be formed in an inter-layer dielectric (ILD) layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer. The above are non-limiting examples of devices/structures that can be made and/or improved using the method described herein.

In some embodiments, the semiconductor substrate 10 is an intermediate structure fabricated during processing of an IC, or a portion thereof, that may include logic circuits, memory structures, passive components (such as resistors, capacitors, and inductors), and active components such diodes, field-effect transistors (FETs), fin-like FETs (FinFETs), other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

Embodiments of the present disclosure provide improved removal of residual photoresist and scum after development. Embodiments of the present disclosure provide improved line width resolution of photoresist patterns. Embodiments of the present disclosure provide a greater than 3% improvement in line width roughness and critical dimension. Embodiments of the present disclosure also provide a 3% or greater reduction in exposure dose, an improvement in the peeling window. In addition, embodiments of the present disclosure provide a 3% or greater reduction in defects. The compositions and methods of the present disclosure is suitable for resist pitch of less than 40 nm requiring a line width resolution of less than 5 nm and an energy of less than 50 mj.

An embodiment of the disclosure is a method of manufacturing a semiconductor device, including forming a photoresist underlayer including a photoresist underlayer composition over a semiconductor substrate and forming a photoresist layer comprising a photoresist composition over the photoresist underlayer. The photoresist layer is selectively exposed to actinic radiation, and the photoresist layer is developed to form a pattern in the photoresist layer. The photoresist underlayer composition includes: a first polymer having one or more of pendant acid-labile groups and pendant epoxy groups, a second polymer having one or more crosslinking groups, an acid generator, a quencher or photodecomposable base, and a solvent. The photoresist underlayer composition includes 0 wt. % to 10 wt. % of the quencher or photodecomposable base based on a total weight of the first and second polymers. In an embodiment, the photoresist composition includes: a third polymer, a photoactive compound, and a solvent. In an embodiment, the acid generator is a photoacid generator. In an embodiment, the method includes heating the photoresist underlayer at a temperature of 40° C. to 300° C. for 10 seconds to 10 minutes before forming the photoresist layer. In an embodiment, the method includes heating the photoresist layer at a temperature of 80° C. to 300° C. for 10 seconds to 10 minutes after selectively exposing the photoresist layer to actinic radiation. In an embodiment, the photoresist composition includes a metal-containing photoresist. In an embodiment, the pendant acid-labile groups or pendant epoxy groups are greater than 5 wt. % to 50 wt. % of the first polymer. In an embodiment, the crosslinking groups are greater than 30 wt. % to 70 wt. % of the second polymer. In an embodiment, the first polymer contains both acid-labile groups and epoxy groups. In an embodiment, portions of the photoresist layer selectively exposed to actinic radiation and portions of the photoresist underlayer below the portions of the photoresist layer selectively exposed to actinic radiation are removed during the developing. In an embodiment, the acid labile group or epoxy group is connected to the first polymer by a connecting group selected from substituted and unsubstituted, branched and unbranched aliphatic groups, branched and unbranched aromatic groups, unsubstituted or halogen-substituted 1-9 carbon cyclic and noncyclic groups, or —S—, —P—, —$P(O_2)$—, —C(═O)S—, —C(═O)O—, —O—, —N—, —C(═O)N—, —$SO_2O$—, —$SO_2S$—, —SO—, and —$SO_2$—, or a carboxylic acid group, ether group, ketone group, ester group, or benzene group. In an embodiment, the acid labile group is one or more of

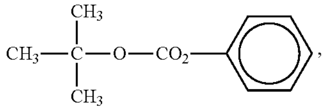
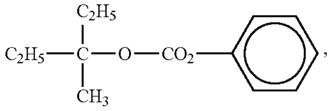
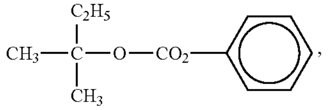
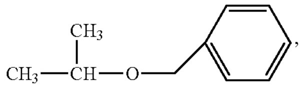
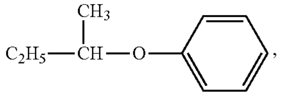
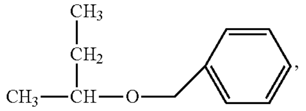
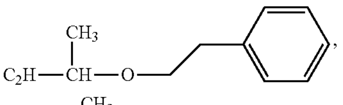
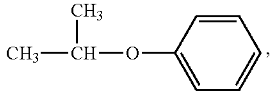
and -continued

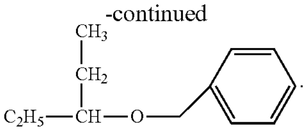

In an embodiment, the acid labile group is a cyclic acetal group. In an embodiment, the epoxy groups are one or more of

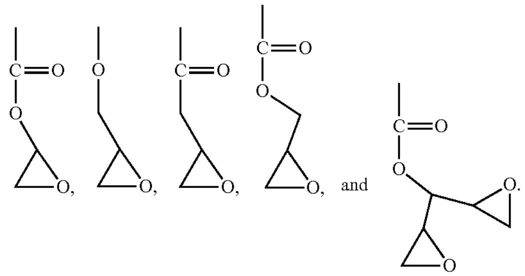

In an embodiment, the acid generator is one or more compounds including a combination of a cation and an anion selected from:

cations

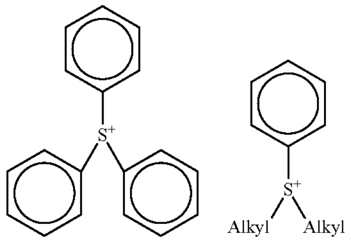

anions

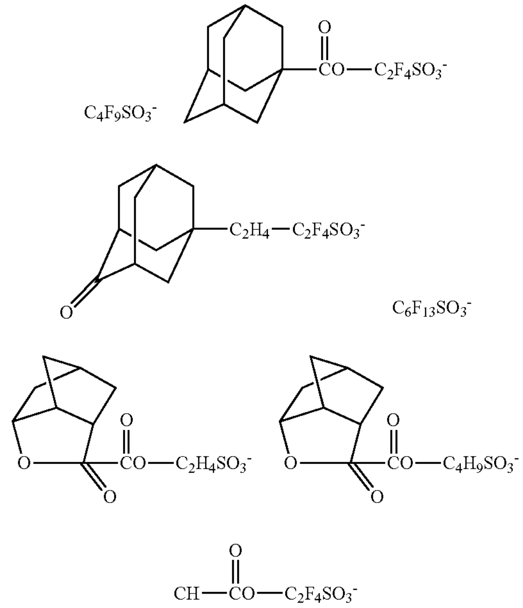

-continued
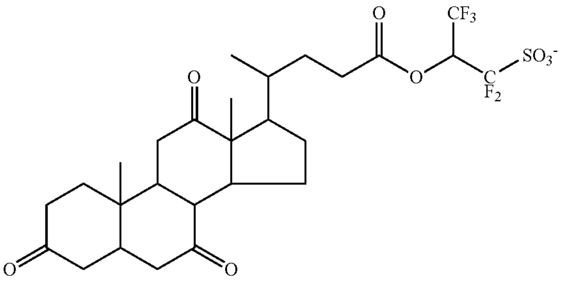
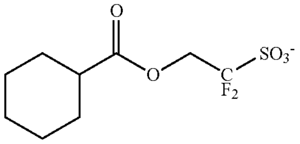
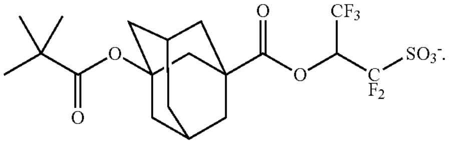
In an embodiment, the quencher is one or more of
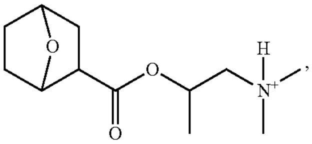
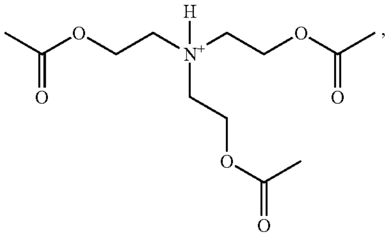
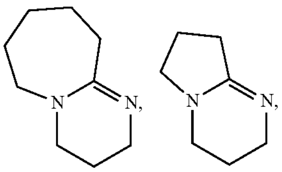
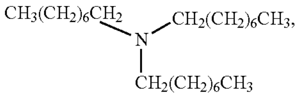
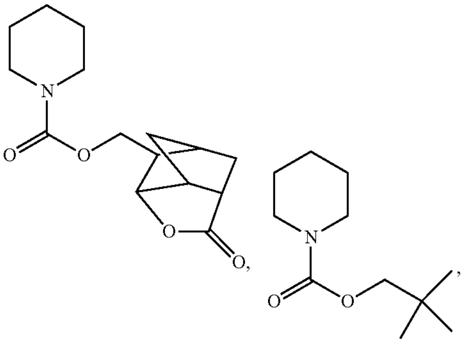
-continued
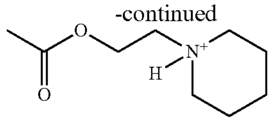
and
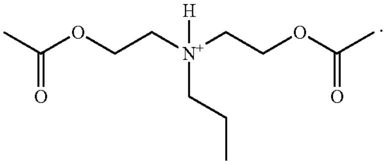
In an embodiment, the photodecomposable base is one or more compounds including a combination of a cation and anion selected from:
cations
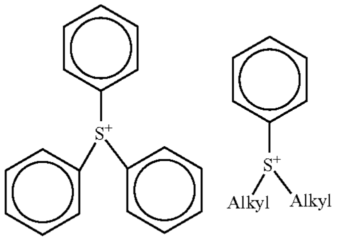
anions
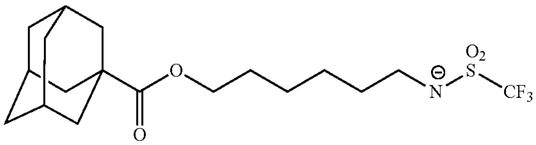
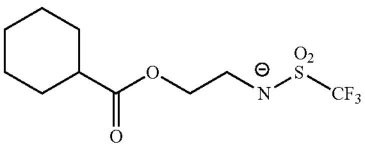
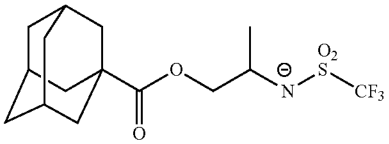
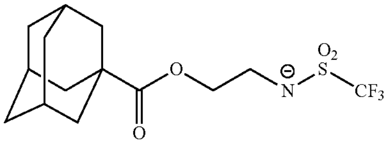
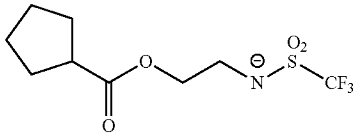
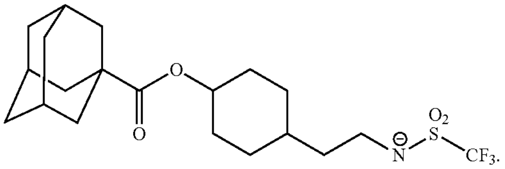
In an embodiment, the crosslinking group is connected to the second polymer by a connecting group selected from substituted and unsubstituted, branched and unbranched aliphatic groups, branched and unbranched aromatic groups, unsubstituted or halogen-substituted 1-9 carbon cyclic and non-cyclic groups, or —S—, —P—, —P($O_2$)—, —C(═O)S—, —C(═O)O—, —O—, —N—, —C(═O)N—, —$SO_2$O—, —$SO_2$S—, —SO—, and —$SO_2$—, or a carboxylic acid group, ether group, ketone group, ester group, or benzene group. In an embodiment, the crosslinking group is one or more of

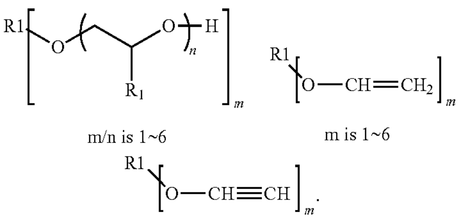

m/n is 1~6    m is 1~6 m is 1~6

In an embodiment, the photoresist underlayer composition includes 0.1 wt. % to 20 wt. % of the acid generator based on a weight of the acid generator and the first polymer.

Another embodiment of the disclosure is a photoresist underlayer composition, including: a first polymer having one or more of pendant acid-labile groups and pendant epoxy groups, a second polymer having one or more crosslinking groups, an acid generator, and a solvent. In an embodiment, the composition includes greater than 0 wt. % to 10 wt. % of a quencher or photodecomposable base based on a total weight of the first and second polymers. In an embodiment, the acid generator is a photoacid generator. In an embodiment, the pendant acid-labile groups or pendant epoxy groups are greater than 5 wt. % to 50 wt. % of the first polymer. In an embodiment, the crosslinking groups are greater than 30 wt. % to 70 wt. % of the second polymer. In an embodiment, the first polymer contains both acid-labile groups and epoxy groups. In an embodiment, the acid labile group or epoxy group is connected to the first polymer by a connecting group selected from substituted and unsubstituted, branched and unbranched aliphatic groups, branched and unbranched aromatic groups, unsubstituted or halogen-substituted 1-9 carbon cyclic and non-cyclic groups, or —S—, —P—, —P($O_2$)—, —C(═O)S—, —C(═O)O—, —O—, —N—, —C(═O)N—, —$SO_2$O—, —$SO_2$S—, —SO—, and —$SO_2$—, or a carboxylic acid group, ether group, ketone group, ester group, or benzene group. In an embodiment, the acid labile group is one or more of

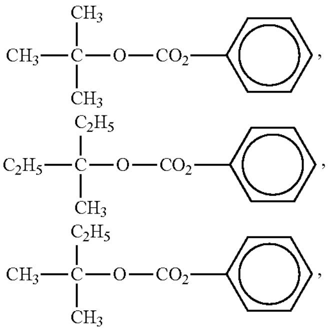

-continued

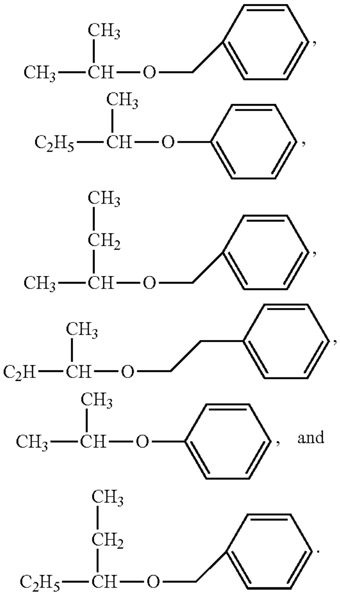

In an embodiment, the acid labile group is a cyclic acetal group. In an embodiment, the epoxy groups are one or more of

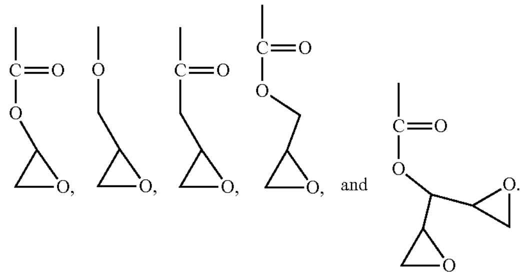

In an embodiment, the quencher is one or more of

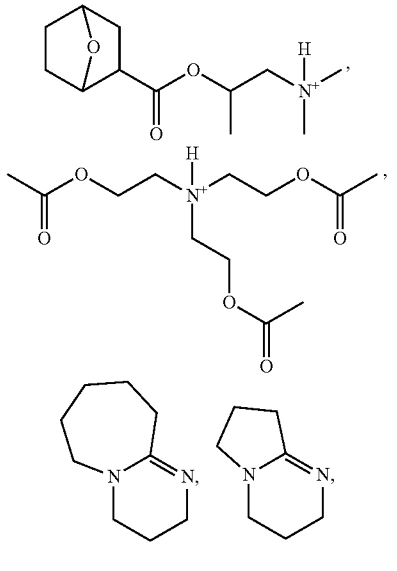

-continued
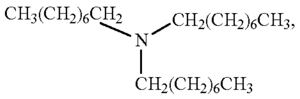
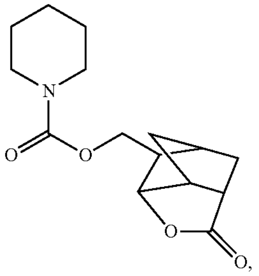
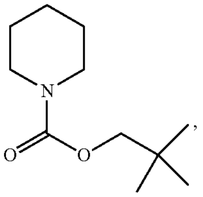
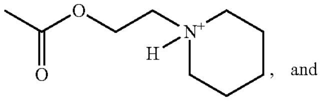
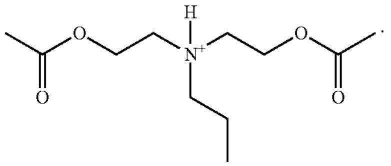
In an embodiment, the photodecomposable base is one or more compounds including a combination of a cation and an anion selected from:
cations
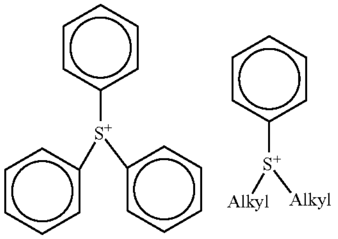
anions
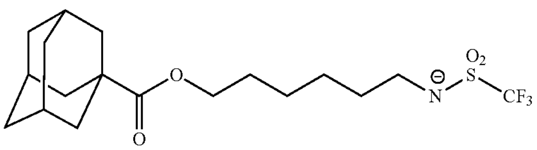
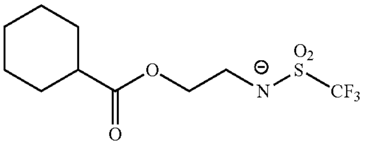
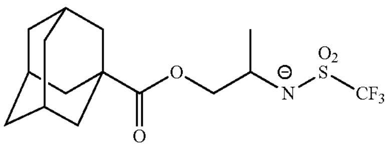
-continued
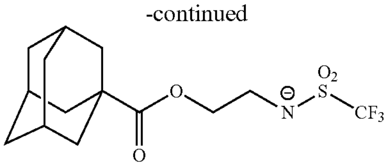
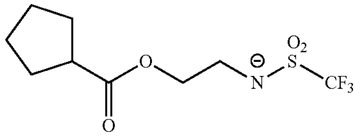
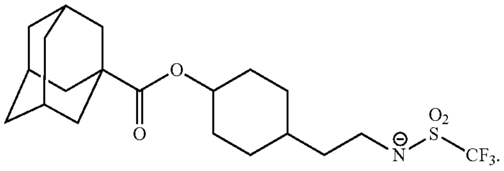
In an embodiment, the photoacid generator is one or more compounds including a combination of a cation and an anion selected from:
cations
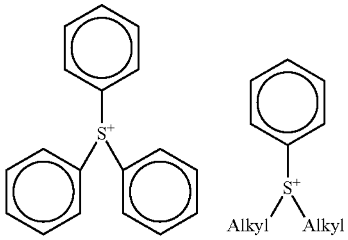
anions
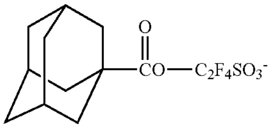
$C_4F_9SO_3^-$
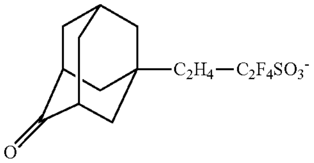
$C_6F_{13}SO_3^-$
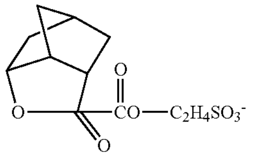
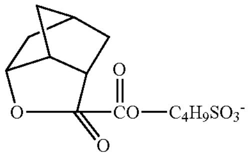
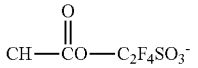
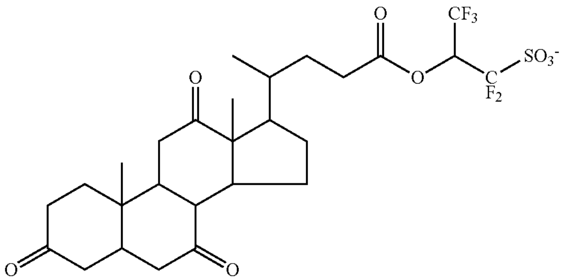

-continued

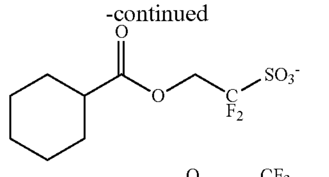

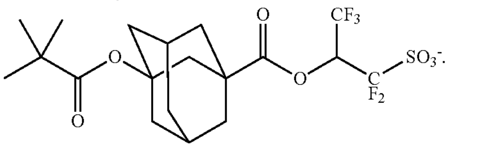

In an embodiment, the crosslinking group is connected to the second polymer by a connecting group selected from substituted and unsubstituted, branched and unbranched aliphatic groups, branched and unbranched aromatic groups, unsubstituted or halogen-substituted 1-9 carbon cyclic and non-cyclic groups, or —S—, —P—, —P($O_2$)—, —C(═O)S—, —C(═O)O—, —O—, —N—, —C(═O)N—, —$SO_2$O—, —$SO_2$S—, —SO—, and —$SO_2$—, or a carboxylic acid group, ether group, ketone group, ester group, or benzene group. In an embodiment, the crosslinking group is one or more of

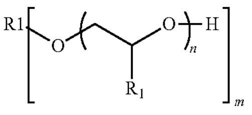

m/n is 1~6

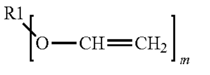

m is 1~6

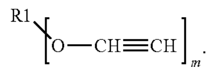

m is 1~6

In an embodiment, the photoresist underlayer composition comprises 0.1 wt. % to 20 wt. % of the acid generator based on a weight of the acid generator and the first polymer.

Another embodiment of the disclosure is a method of manufacturing a semiconductor device, including forming a photoresist underlayer including a photoresist underlayer composition over a semiconductor substrate. The photoresist underlayer is crosslinked. A photoresist layer including a photoresist composition is formed over the photoresist underlayer, and the photoresist layer is patterned. The photoresist underlayer composition includes: a first polymer having pendant acid-labile groups or pendant epoxy groups, a second polymer having crosslinking groups, an acid generator; and a solvent. In an embodiment, the photoresist composition includes: a third polymer, a photoactive compound, and a solvent. In an embodiment, the photoresist underlayer composition includes greater than 0 wt. % to 10 wt. % of a quencher or photodecomposable base based on a total weight of the first and second polymers. In an embodiment, the acid labile group or epoxy group is connected to the first polymer by a connecting group selected from substituted and unsubstituted, branched and unbranched aliphatic groups, branched and unbranched aromatic groups, unsubstituted or halogen-substituted 1-9 carbon cyclic and non-cyclic groups, or —S—, —P—, —P($O_2$)—, —C(═O)S—, —C(═O)O—, —O—, —N—, —C(═O)N—, —$SO_2$O—, —$SO_2$S—, —SO—, and —$SO_2$—, or a carboxylic acid group, ether group, ketone group, ester group, or benzene group. In an embodiment, the crosslinking group is connected to the second polymer by a connecting group selected from substituted and unsubstituted, branched and unbranched aliphatic groups, branched and unbranched aromatic groups, 1-9 carbon cyclic and non-cyclic groups, unsubstituted or halogen-substituted groups, or —S—, —P—, —P($O_2$)—, —C(═O)S—, —C(═O)O—, —O—, —N—, —C(═O)N—, —$SO_2$O—, —$SO_2$S—, —SO—, and —$SO_2$—, or a carboxylic acid group, ether group, ketone group, ester group, or benzene group. In an embodiment, the photoresist underlayer composition includes 0.1 wt. % to 20 wt. % of the acid generator based on a weight of the acid generator and the first polymer. In an embodiment, the method includes forming a second underlayer over the photoresist underlayer, wherein the second underlayer includes 0.1 wt. % to 10 wt. % of a quencher or photodecomposable base.

Another embodiment of the disclosure is a photoresist underlayer composition, including: a first polymer having one or more of pendant acid-labile groups and pendant epoxy groups, a second polymer having one or more crosslinking groups, an acid generator, and a solvent. In an embodiment, the composition includes greater than 0 wt. % to 10 wt. % of a quencher or photodecomposable base based on a total weight of the first and second polymers. In an embodiment, the acid generator is a photoacid generator. In an embodiment, the pendant acid-labile groups or pendant epoxy groups are greater than 5 at. % to 50 at. % of the first polymer. In an embodiment, the crosslinking groups are greater than 30 at. % to 70 at. % of the second polymer. In an embodiment, the first polymer contains both acid-labile groups and epoxy groups. In an embodiment, the acid labile group or epoxy group is connected to the first polymer by a connecting group selected from substituted and unsubstituted, branched and unbranched aliphatic groups, branched and unbranched aromatic groups, unsubstituted or halogen-substituted 1-9 carbon cyclic and non-cyclic groups, or —S—, —P—, —P($O_2$)—, —C(═O)S—, —C(═O)O—, —O—, —N—, —C(═O)N—, —$SO_2$O—, —$SO_2$S—, —SO—, and —$SO_2$—, or a carboxylic acid group, ether group, ketone group, ester group, or benzene group. In an embodiment, the acid labile group is one or more of

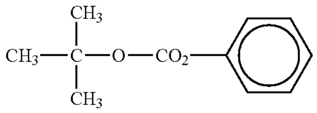

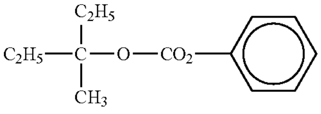

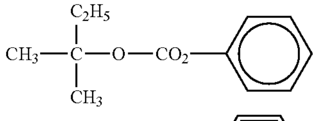

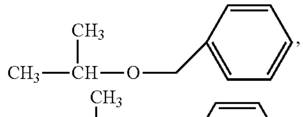

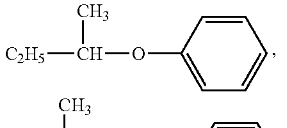

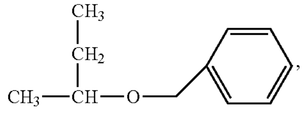

-continued
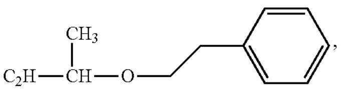
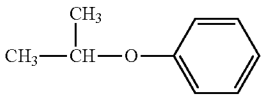
, and
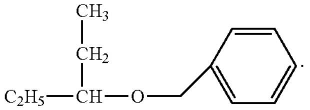
In an embodiment, the acid labile group is a cyclic acetal group. In an embodiment, the epoxy groups are one or more of
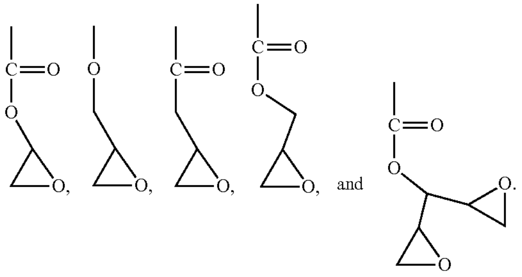
In an embodiment, the quencher is one or more of
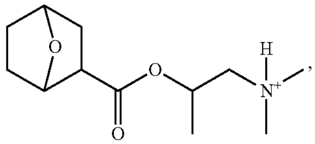
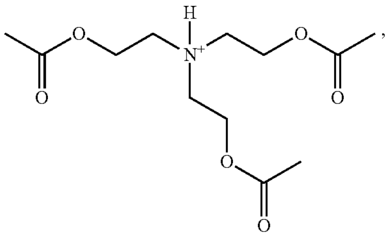
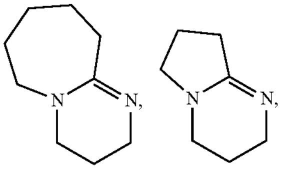
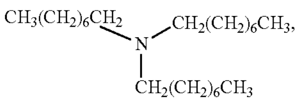
-continued
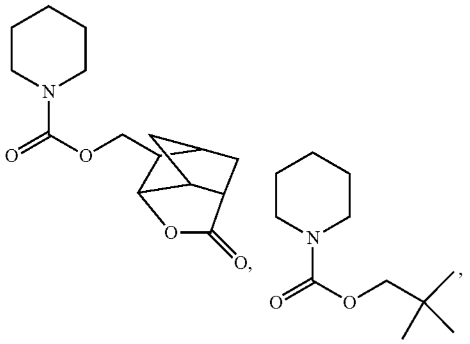
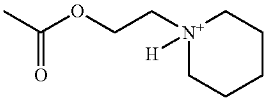
, and
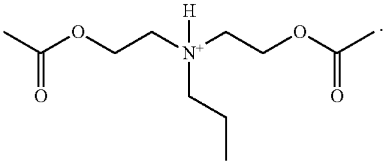
In an embodiment, the photodecomposable base is one or more compounds including a combination of a cation and an anion selected from:
cations
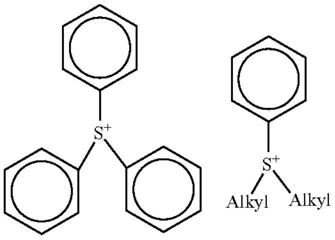
anions
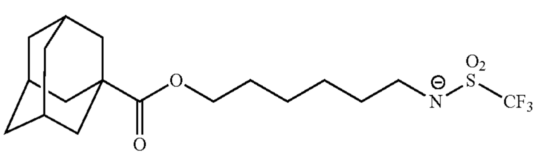
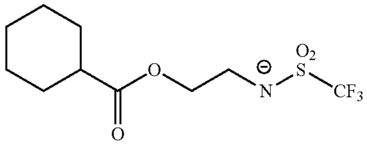
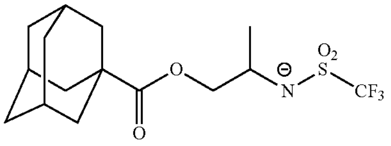
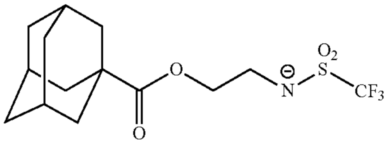

-continued

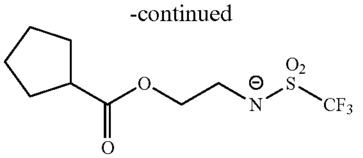

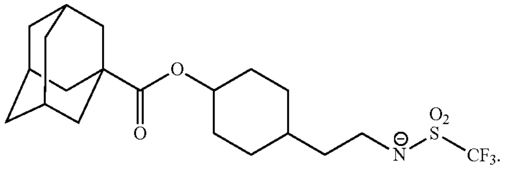

In an embodiment, the photoacid generator is one or more compounds including a combination of a cation and an anion selected from:

cations

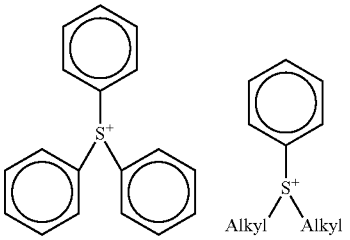

anions

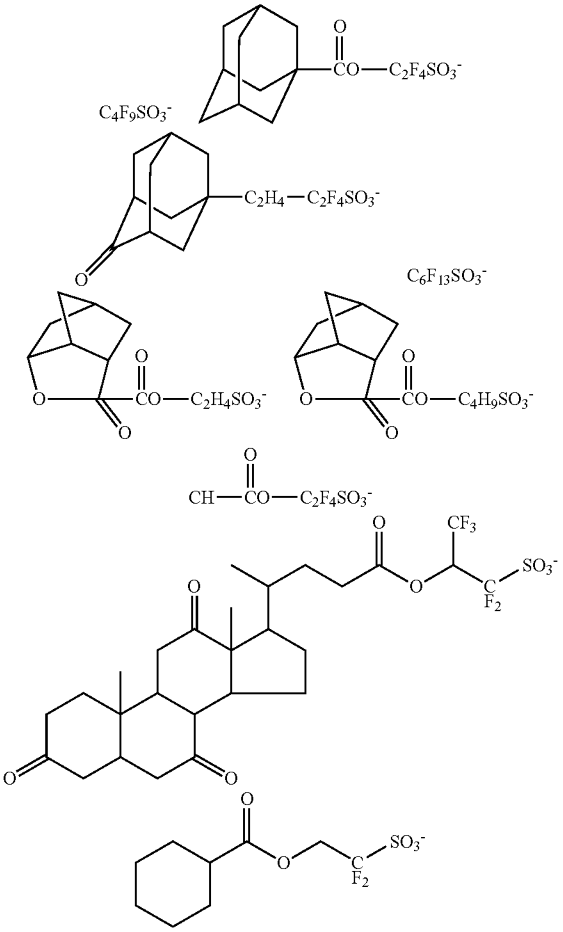

-continued

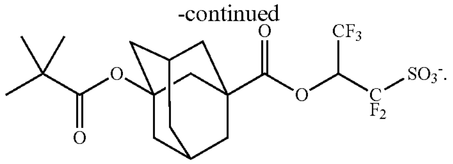

In an embodiment, the crosslinking group is connected to the second polymer by a connecting group selected from substituted and unsubstituted, branched and unbranched aliphatic groups, branched and unbranched aromatic groups, unsubstituted or halogen-substituted 1-9 carbon cyclic and non-cyclic groups, or —S—, —P—, —P($O_2$)—, —C(═O)S—, —C(═O)O—, —O—, —N—, —C(═O)N—, —$SO_2$O—, —$SO_2$S—, —SO—, and —$SO_2$—, or a carboxylic acid group, ether group, ketone group, ester group, or benzene group. In an embodiment, the crosslinking group is one or more of

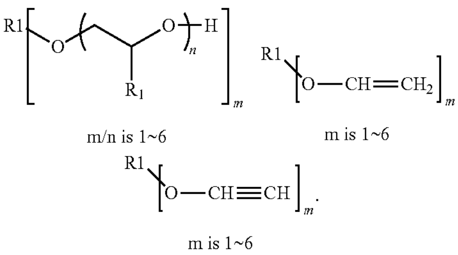

In an embodiment, the photoresist underlayer composition comprises 0.1 wt. % to 20 at. % of the acid generator based on a weight of the acid generator and the first polymer.

Another embodiment of the disclosure is a method of manufacturing a semiconductor device, including forming a first layer over a substrate. The first layer includes a first layer composition including: a first polymer having pendant acid-labile groups or pendant epoxy groups, a second polymer having crosslinking groups, and an acid generator. The first layer is heated and a resist layer is formed over the first layer. The resist layer includes a resist composition including a third polymer and a photoactive compound. The resist layer and the first layer are patterned. In an embodiment, the method includes extending a pattern formed in the resist layer and the first layer into the substrate. In an embodiment, extending the pattern formed in the resist layer and the first layer into the substrate includes etching. In an embodiment, the heating the first layer includes crosslinking the first layer. In an embodiment, the patterning the resist layer and the first layer includes: patternwise exposing the resist layer to actinic radiation, heating the patternwise exposed resist layer, and developing the patternwise exposed resist layer and the first layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:

forming a photoresist underlayer comprising a photoresist underlayer composition over a semiconductor substrate;

forming a photoresist layer comprising a photoresist composition over the photoresist underlayer;

selectively exposing the photoresist layer to actinic radiation; and developing the photoresist layer to form a pattern in the photoresist layer, wherein the photoresist underlayer composition comprises:

a first polymer comprising pendant acid-labile groups including one or more structures selected from

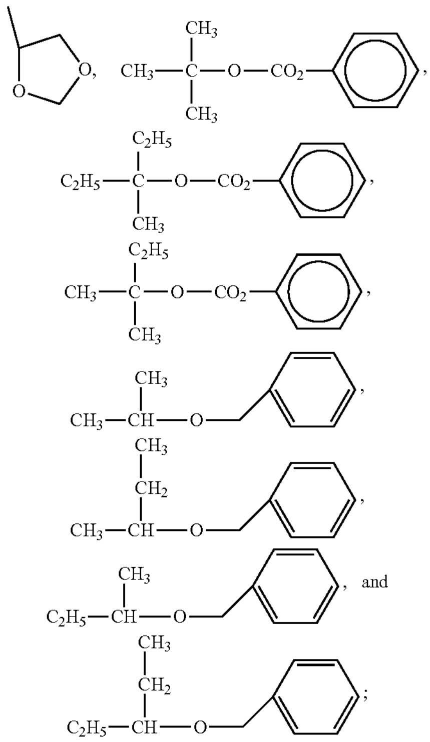

a second polymer comprising one or more crosslinking groups;

an acid generator;

a photodecomposable base, wherein the photoresist underlayer composition comprises 0.1 wt. % to 10 wt. % of the photodecomposable base based on a total weight of the first and second polymers; and a solvent.

2. The method according to claim 1, wherein the photoresist composition comprises:

a third polymer;

a photoactive compound; and a solvent.

3. The method according to claim 1, wherein the acid generator is a photoacid generator.

4. The method according to claim 1, further comprising heating the photoresist underlayer at a temperature of 40° C. to 300° C. for 10 seconds to 10 minutes before forming the photoresist layer.

5. The method according to claim 1, further comprising heating the photoresist layer at a temperature of 80° C. to 300° C. for 10 seconds to 10 minutes after the selectively exposing the photoresist layer to actinic radiation.

6. The method according to claim 1, wherein the photoresist composition comprises a metal-containing photoresist.

7. The method according to claim 1, wherein the first polymer further comprises pendant epoxy groups, and the pendant acid-labile groups and the pendant epoxy groups are greater than 5 wt. % to 50 wt. % of the first polymer.

8. The method according to claim 1, wherein the crosslinking groups are greater than 30 wt. % to 70 wt. % of the second polymer.

9. The method according claim 1, wherein the first polymer further comprises pendant epoxy groups.

10. The method according to claim 1, further comprising selectively exposing the photoresist underlayer to actinic radiation, wherein portions of the photoresist layer and portions of the photoresist underlayer selectively exposed to actinic radiation are removed during the developing.

11. A method of manufacturing a semiconductor device, comprising:

forming a photoresist underlayer comprising a photoresist underlayer composition over a semiconductor substrate;

crosslinking the photoresist underlayer;

forming a photoresist layer comprising a photoresist composition over the photoresist underlayer; and patterning the photoresist layer;

wherein the photoresist underlayer composition comprises:

a first polymer comprising pendant acid-labile groups including one or more structures selected from

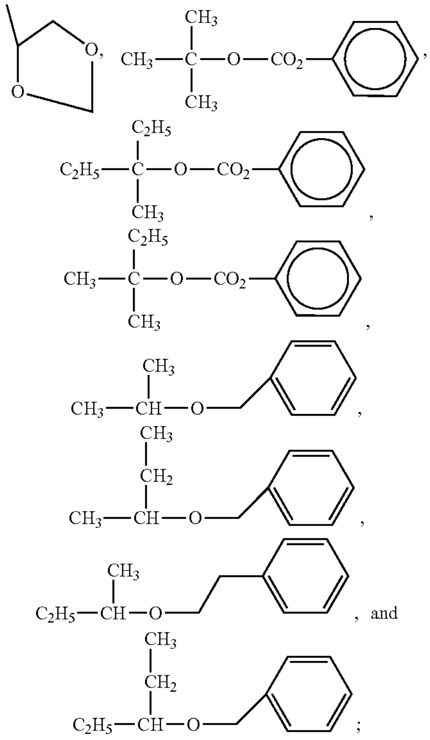

a second polymer comprising crosslinking groups;

an acid generator, a photodecomposable base; and a solvent.

12. The method according to claim 11, wherein the photoresist composition comprises:

a third polymer;

a photoactive compound; and a solvent.

13. The method according to claim 11, wherein the photoresist underlayer composition comprises greater than 0 wt. % to 10 wt. % of the photodecomposable base based on a total weight of the first and second polymers.

14. The method according to claim 11, wherein the first polymer further comprises pendant epoxy groups, and one or more selected from the pendant acid labile groups and the pendant epoxy groups are connected to the first polymer by a connecting group selected from substituted and unsubstituted, branched and unbranched aliphatic groups, branched and unbranched aromatic groups, unsubstituted or halogen-substituted 1-9 carbon cyclic and non-cyclic groups, or —S—, —P—, —P($O_2$)—, —C(═O)S—, —C(═O)O—, —O—, —N—, —C(═O)N—, —$SO_2$O—, —$SO_2$S—, —SO—, and —$SO_2$—, or a carboxylic acid group, ether group, ketone group, ester group, or benzene group.

15. The method according to claim 11, wherein the crosslinking groups are connected to the second polymer by a connecting group selected from substituted and unsubstituted, branched and unbranched aliphatic groups, branched and unbranched aromatic groups, unsubstituted or halogen-substituted 1-9 carbon cyclic and non-cyclic groups, or —S—, —P—, —P($O_2$)—, —C(═O)S—, —C(═O)O—, —O—, —N—, —C(═O)N—, —$SO_2$O—, —$SO_2$S—, —SO—, and —$SO_2$—, or a carboxylic acid group, ether group, ketone group, ester group, or benzene group.

16. A method of manufacturing a semiconductor device, comprising:

forming a first layer over a substrate, wherein the first layer includes a first layer composition comprising:

a first polymer comprising pendant acid-labile groups including one or more structures selected from

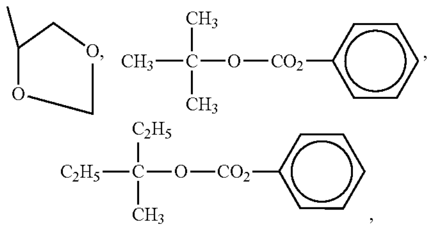

-continued

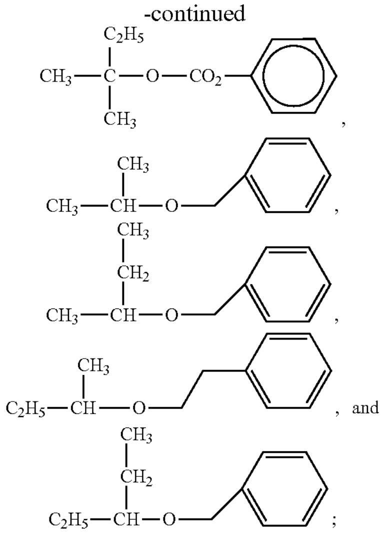

a second polymer comprising crosslinking groups;

a photodecomposable base; and an acid generator;

heating the first layer;

forming a resist layer over the first layer, wherein the resist layer includes a resist composition comprising:

a third polymer; and a photoactive compound; and patterning the resist layer and the first layer.

17. The method according to claim 16, further comprising extending a pattern formed in the resist layer and the first layer into the substrate.

18. The method according to claim 17, wherein the extending a pattern formed in the resist layer and the first layer into the substrate comprises etching.

19. The method according to claim 16, wherein the first polymer further comprises pendant epoxy groups, and the heating the first layer includes crosslinking the first layer.

20. The method according to claim 16, wherein the patterning the resist layer and the first layer includes:

patternwise exposing the resist layer and the first layer to actinic radiation;

heating the patternwise exposed resist layer and first layer; and developing the patternwise exposed resist layer and first layer.

* * * * *